United States Patent
Wala

(10) Patent No.: US 10,505,635 B2
(45) Date of Patent: *Dec. 10, 2019

(54) POINT-TO-MULTIPOINT DIGITAL RADIO FREQUENCY TRANSPORT

(71) Applicant: CommScope Technologies LLC, Hickory, NC (US)

(72) Inventor: Philip M. Wala, Savage, MN (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/144,219

(22) Filed: May 2, 2016

(65) Prior Publication Data
US 2016/0248508 A1 Aug. 25, 2016

Related U.S. Application Data

(63) Continuation of application No. 14/054,223, filed on Oct. 15, 2013, now Pat. No. 9,332,402, which is a
(Continued)

(51) Int. Cl.
*H04B 7/14* (2006.01)
*H04B 10/2575* (2013.01)
(Continued)

(52) U.S. Cl.
CPC .... *H04B 10/25753* (2013.01); *H03M 7/4006* (2013.01); *H04B 7/2606* (2013.01);
(Continued)

(58) Field of Classification Search
CPC .......... H04B 10/2575; H04B 10/25751; H04B 10/25752; H04B 10/25753; H04B 10/29; H04W 88/085
(Continued)

(56) References Cited

U.S. PATENT DOCUMENTS

| | | |
|---|---|---|
| 3,931,473 A | 1/1976 | Ferris, Jr. |
| 4,101,834 A | 7/1978 | Stutt et al. |

(Continued)

FOREIGN PATENT DOCUMENTS

| | | |
|---|---|---|
| CA | 2008900 | 1/1998 |
| CN | 1127056 | 7/1996 |

(Continued)

OTHER PUBLICATIONS

Brazilian Patent Office, "Office Action for Brazil Application No. PI0112653-9", "from Foreign Countpart to U.S. Appl. No. 09/619,431", Apr. 8, 2015, pp. 1-14, Published in: BR.

(Continued)

*Primary Examiner* — Sonny Trinh
(74) *Attorney, Agent, or Firm* — Fogg & Powers LLC

(57) ABSTRACT

One embodiment is directed to a system for use with a coverage area in which one or more wireless units wirelessly transmit using a wireless radio frequency spectrum. The system comprises a first unit, and a plurality of second units communicatively coupled to the first unit using at least one communication medium. Each of the plurality of second units generates respective digital RF samples indicative of a respective analog wireless signal received at that second unit. Each of the plurality of second units communicates the respective digital RF samples generated by that second unit to the first unit using the at least one communication medium. The first unit digitally sums corresponding digital RF samples received from the plurality of second units to produce summed digital RF samples. The system is configured so that an input used for base station processing is derived from the resulting summed digital RF samples.

25 Claims, 8 Drawing Sheets

Related U.S. Application Data continuation of application No. 13/662,948, filed on Oct. 29, 2012, now Pat. No. 8,577,286, which is a continuation of application No. 12/617,215, filed on Nov. 12, 2009, now Pat. No. 8,326,218, which is a continuation of application No. 10/740,944, filed on Dec. 19, 2003, now Pat. No. 7,639,982, which is a continuation of application No. 09/619,431, filed on Jul. 19, 2000, now Pat. No. 6,704,545.

(51) Int. Cl.
| | |
|---|---|
| H03M 7/40 | (2006.01) |
| H04B 7/26 | (2006.01) |
| H04L 12/58 | (2006.01) |
| H04L 29/06 | (2006.01) |
| H04N 19/109 | (2014.01) |
| H04N 19/139 | (2014.01) |
| H04N 19/625 | (2014.01) |
| H04N 19/91 | (2014.01) |
| H04Q 11/00 | (2006.01) |
| H04W 4/06 | (2009.01) |
| H04W 4/14 | (2009.01) |
| H04W 88/08 | (2009.01) |
| H04W 4/12 | (2009.01) |

(52) U.S. Cl.
CPC ....... *H04B 10/25754* (2013.01); *H04L 51/28* (2013.01); *H04L 51/38* (2013.01); *H04L 65/1006* (2013.01); *H04N 19/109* (2014.11); *H04N 19/139* (2014.11); *H04N 19/625* (2014.11); *H04N 19/91* (2014.11); *H04Q 11/0067* (2013.01); *H04W 4/06* (2013.01); *H04W 4/14* (2013.01); *H04W 88/08* (2013.01); *H04L 51/04* (2013.01); *H04L 65/1016* (2013.01); *H04Q 2011/0047* (2013.01); *H04W 4/12* (2013.01); *H04W 88/085* (2013.01); *Y10S 370/906* (2013.01); *Y10S 370/907* (2013.01)

(58) Field of Classification Search
USPC .................................. 455/14, 16, 20, 561
See application file for complete search history.

(56) References Cited

U.S. PATENT DOCUMENTS

| | | | |
|---|---|---|---|
| 4,112,488 A | 9/1978 | Smith, III | |
| 4,144,409 A | 3/1979 | Utano et al. | |
| 4,144,411 A | 3/1979 | Frenkiel | |
| 4,183,054 A | 1/1980 | Patisaul et al. | |
| 4,231,116 A | 10/1980 | Sekiguchi et al. | |
| 4,244,046 A | 1/1981 | Brouard et al. | |
| 4,354,167 A | 10/1982 | Terreault et al. | |
| 4,402,076 A | 8/1983 | Krajewski | |
| 4,451,699 A | 5/1984 | Gruenberg | |
| 4,451,916 A | 5/1984 | Casper et al. | |
| 4,456,793 A | 6/1984 | Baker et al. | |
| 4,475,010 A | 10/1984 | Huensch et al. | |
| 4,485,486 A | 11/1984 | Webb et al. | |
| 4,525,861 A | 6/1985 | Freeburg | |
| 4,531,239 A | 7/1985 | Usui | |
| 4,556,760 A | 12/1985 | Goldman | |
| 4,596,051 A | 6/1986 | Feldman | |
| 4,611,323 A | 9/1986 | Hessenmuller | |
| 4,613,990 A | 9/1986 | Halpern | |
| 4,628,501 A | 12/1986 | Loscoe | |
| 4,654,843 A | 3/1987 | Roza et al. | |
| 4,667,319 A * | 5/1987 | Chum | H04J 3/08 370/260 |
| 4,669,107 A | 5/1987 | Eriksson-Lennartsson | |
| 4,691,292 A | 9/1987 | Rothweiler | |
| 4,701,909 A | 10/1987 | Kavehrad et al. | |
| 4,704,733 A | 11/1987 | Kawano | |
| 4,718,004 A | 1/1988 | Dalal | |
| 4,726,644 A | 2/1988 | Mathis | |
| 4,754,451 A | 6/1988 | Eng et al. | |
| 4,755,795 A | 7/1988 | Page | |
| 4,759,000 A | 7/1988 | Reitz | |
| 4,759,051 A | 7/1988 | Han | |
| 4,759,057 A | 7/1988 | De Luca et al. | |
| 4,760,573 A | 7/1988 | Calvignac et al. | |
| 4,790,000 A | 12/1988 | Kinoshita | |
| 4,797,947 A | 1/1989 | Labedz | |
| 4,816,825 A | 3/1989 | Chan et al. | |
| 4,831,662 A | 5/1989 | Kuhn | |
| 4,849,963 A | 7/1989 | Kawano et al. | |
| 4,868,862 A | 9/1989 | Ryoichi et al. | |
| 4,881,082 A | 11/1989 | Graziano | |
| 4,916,460 A | 4/1990 | Powell | |
| 4,920,533 A | 4/1990 | Dufresne et al. | |
| 4,932,049 A | 6/1990 | Lee | |
| 4,959,829 A | 9/1990 | Griesing | |
| 4,977,593 A | 12/1990 | Ballance | |
| 4,999,831 A | 3/1991 | Grace | |
| 5,067,147 A | 11/1991 | Lee | |
| 5,067,173 A | 11/1991 | Gordon et al. | |
| 5,084,869 A | 1/1992 | Russell | |
| 5,134,709 A | 7/1992 | Bi et al. | |
| 5,136,410 A | 8/1992 | Heiling et al. | |
| 5,138,440 A | 8/1992 | Radice | |
| 5,159,479 A | 10/1992 | Takagi | |
| 5,175,867 A | 12/1992 | Wejke et al. | |
| 5,193,109 A | 3/1993 | Chien-Yeh Lee | |
| 5,243,598 A | 9/1993 | Lee | |
| 5,251,053 A | 10/1993 | Heidemann | |
| 5,267,261 A | 11/1993 | Blakeney, II et al. | |
| 5,272,700 A | 12/1993 | Hansen et al. | |
| 5,278,690 A | 1/1994 | Vella-Coleiro | |
| 5,280,472 A | 1/1994 | Gilhousen et al. | |
| 5,285,469 A | 2/1994 | Vanderpool | |
| 5,297,193 A | 3/1994 | Bouix et al. | |
| 5,299,198 A | 3/1994 | Kay et al. | |
| 5,301,056 A | 4/1994 | O'Neill | |
| 5,303,287 A | 4/1994 | Laborde | |
| 5,305,308 A | 4/1994 | English et al. | |
| 5,309,474 A | 5/1994 | Gilhousen et al. | |
| 5,313,461 A | 5/1994 | Ahl et al. | |
| 5,321,736 A | 6/1994 | Beasley | |
| 5,321,849 A | 6/1994 | Lemson | |
| 5,339,184 A | 8/1994 | Tang | |
| 5,381,459 A | 1/1995 | Lappington | |
| 5,392,453 A | 2/1995 | Gudmundson et al. | |
| 5,400,391 A | 3/1995 | Emura et al. | |
| 5,442,681 A | 8/1995 | Kotzin et al. | |
| 5,442,700 A | 8/1995 | Snell et al. | |
| 5,457,557 A | 10/1995 | Zarem et al. | |
| 5,461,627 A | 10/1995 | Rypinski | |
| 5,499,047 A | 3/1996 | Terry et al. | |
| 5,513,176 A | 4/1996 | Dean et al. | |
| 5,519,691 A | 5/1996 | Darcie et al. | |
| 5,528,582 A | 6/1996 | Bodeep et al. | |
| 5,533,011 A | 7/1996 | Dean et al. | |
| 5,546,397 A | 8/1996 | Mahany | |
| 5,552,920 A | 9/1996 | Glynn | |
| 5,566,168 A | 10/1996 | Dent | |
| 5,579,341 A | 11/1996 | Smith et al. | |
| 5,586,121 A | 12/1996 | Moura et al. | |
| 5,587,734 A | 12/1996 | Lauder et al. | |
| 5,592,470 A | 1/1997 | Rudrapatna et al. | |
| 5,603,080 A | 2/1997 | Kallander et al. | |
| 5,619,202 A | 4/1997 | Wilson et al. | |
| 5,621,730 A | 4/1997 | Kelley | |
| 5,621,786 A | 4/1997 | Fischer et al. | |
| 5,627,879 A * | 5/1997 | Russell | H04W 88/085 370/328 |
| 5,630,204 A | 5/1997 | Hylton et al. | |
| 5,642,405 A | 6/1997 | Fischer et al. | |
| 5,644,622 A | 7/1997 | Russell et al. | |
| 5,657,374 A | 8/1997 | Russell et al. | |
| 5,682,256 A | 10/1997 | Motley et al. | |

(56) References Cited

U.S. PATENT DOCUMENTS

| | | |
|---|---|---|
| 5,708,961 A | 1/1998 | Hylton et al. |
| 5,715,235 A | 2/1998 | Sawahashi et al. |
| 5,724,385 A | 3/1998 | Levin et al. |
| 5,732,076 A | 3/1998 | Ketseoglou et al. |
| 5,748,683 A | 5/1998 | Smith et al. |
| 5,752,170 A | 5/1998 | Clifford |
| 5,761,619 A | 6/1998 | Danne et al. |
| 5,765,097 A | 6/1998 | Dail |
| 5,765,099 A | 6/1998 | Georges et al. |
| 5,771,449 A | 6/1998 | Blasing et al. |
| 5,774,085 A | 6/1998 | Yanagimoto et al. |
| 5,774,660 A | 6/1998 | Brendel et al. |
| 5,774,789 A | 6/1998 | van der Kaay et al. |
| 5,781,541 A | 7/1998 | Schneider |
| 5,781,859 A | 7/1998 | Beasley |
| 5,781,865 A | 7/1998 | Gammon |
| 5,802,173 A | 9/1998 | Hamilton-Piercy et al. |
| 5,805,983 A | 9/1998 | Naidu et al. |
| 5,809,395 A | 9/1998 | Hamilton-Piercy et al. |
| 5,809,422 A * | 9/1998 | Raleigh ............ H04B 7/2609 455/444 |
| 5,809,431 A | 9/1998 | Bustamante et al. |
| 5,812,605 A | 9/1998 | Smith et al. |
| 5,818,883 A | 10/1998 | Smith et al. |
| 5,822,324 A | 10/1998 | Kostresti et al. |
| 5,852,651 A | 12/1998 | Fischer et al. |
| 5,874,914 A | 2/1999 | Krasner |
| 5,878,325 A | 3/1999 | Dail |
| 5,907,544 A | 5/1999 | Rypinski |
| 5,930,682 A | 7/1999 | Schwartz et al. |
| 5,946,622 A | 8/1999 | Bojeryd |
| 5,969,837 A | 10/1999 | Farber et al. |
| 5,978,650 A | 11/1999 | Fischer et al. |
| 5,987,014 A | 11/1999 | Magill et al. |
| 6,005,506 A | 12/1999 | Bazarjani et al. |
| 6,005,884 A | 12/1999 | Cook et al. |
| 6,009,130 A | 12/1999 | Lurey et al. |
| 6,014,366 A | 1/2000 | Ichiyoshi |
| 6,034,950 A | 3/2000 | Sauer et al. |
| 6,061,089 A | 5/2000 | Tonkin et al. |
| 6,108,113 A | 8/2000 | Fee |
| 6,108,550 A | 8/2000 | Wiorek et al. |
| 6,108,626 A | 8/2000 | Cellario et al. |
| 6,112,086 A | 8/2000 | Wala |
| 6,122,529 A | 9/2000 | Sabat, Jr. et al. |
| 6,128,470 A | 10/2000 | Naidu et al. |
| 6,128,471 A | 10/2000 | Quelch et al. |
| 6,147,786 A | 11/2000 | Pan |
| 6,150,993 A | 11/2000 | Dobrovolny |
| 6,157,659 A | 12/2000 | Bird |
| 6,181,687 B1 | 1/2001 | Bisdikian |
| 6,188,693 B1 | 2/2001 | Murakami |
| 6,192,216 B1 | 2/2001 | Sabat, Jr. et al. |
| 6,198,558 B1 | 3/2001 | Graves et al. |
| 6,222,660 B1 | 4/2001 | Traa |
| 6,223,021 B1 | 4/2001 | Silvia et al. |
| 6,226,274 B1 | 5/2001 | Reese et al. |
| 6,253,094 B1 | 6/2001 | Schmutz |
| 6,259,910 B1 | 7/2001 | Fairfield et al. |
| 6,262,981 B1 | 7/2001 | Schmutz |
| 6,263,135 B1 | 7/2001 | Wade |
| 6,275,990 B1 | 8/2001 | Dapper et al. |
| 6,298,246 B1 | 10/2001 | Lysejko et al. |
| 6,307,877 B1 | 10/2001 | Philips et al. |
| 6,308,085 B1 | 10/2001 | Shoki |
| 6,317,884 B1 | 11/2001 | Eames et al. |
| 6,336,042 B1 | 1/2002 | Dawson et al. |
| 6,337,754 B1 | 1/2002 | Imajo |
| 6,349,200 B1 | 2/2002 | Sabat, Jr. et al. |
| 6,353,600 B1 | 3/2002 | Schwartz et al. |
| 6,356,369 B1 | 3/2002 | Farhan |
| 6,356,374 B1 | 3/2002 | Farhan |
| 6,362,908 B1 | 3/2002 | Kimbrough et al. |
| 6,373,611 B1 | 4/2002 | Farhan |
| 6,373,887 B1 | 4/2002 | Aiyagari et al. |
| 6,374,124 B1 | 4/2002 | Slabinski |
| 6,377,640 B2 | 4/2002 | Trans |
| 6,442,405 B1 | 8/2002 | Hiramatsu et al. |
| 6,449,071 B1 | 9/2002 | Farhan et al. |
| 6,463,301 B1 | 10/2002 | Bevan et al. |
| 6,466,572 B1 * | 10/2002 | Ethridge ............ H04B 10/272 370/352 |
| 6,480,551 B1 | 11/2002 | Ohishi et al. |
| 6,480,702 B1 | 11/2002 | Sabat, Jr. |
| 6,486,907 B1 * | 11/2002 | Farber ............ H04H 40/90 348/E7.05 |
| 6,498,936 B1 | 12/2002 | Raith |
| 6,504,831 B1 | 1/2003 | Greenwood et al. |
| 6,535,720 B1 | 3/2003 | Kintis et al. |
| 6,567,473 B1 | 5/2003 | Tzannes |
| 6,580,905 B1 | 6/2003 | Naidu et al. |
| 6,594,496 B2 | 7/2003 | Schwartz |
| 6,622,013 B1 | 9/2003 | Miyoshi et al. |
| 6,643,498 B1 | 11/2003 | Miyajima |
| 6,667,973 B1 | 12/2003 | Gorshe et al. |
| 6,674,966 B1 | 1/2004 | Koonen |
| 6,697,603 B1 * | 2/2004 | Lovinggood ...... H04B 7/15528 370/315 |
| 6,704,545 B1 * | 3/2004 | Wala ............ H04B 10/25754 370/907 |
| 6,729,929 B1 | 5/2004 | Sayers et al. |
| 6,731,904 B1 | 5/2004 | Judd |
| 6,738,581 B2 | 5/2004 | Handelman |
| 6,745,003 B1 | 6/2004 | Maca et al. |
| 6,751,417 B1 | 6/2004 | Combs et al. |
| 6,768,745 B1 | 7/2004 | Gorshe et al. |
| 6,771,933 B1 | 8/2004 | Eng et al. |
| 6,785,558 B1 | 8/2004 | Stratford et al. |
| 6,799,020 B1 | 9/2004 | Heidmann et al. |
| 6,801,767 B1 | 10/2004 | Schwartz et al. |
| 6,807,374 B1 | 10/2004 | Imajo et al. |
| 6,826,163 B2 | 11/2004 | Mani et al. |
| 6,826,164 B2 | 11/2004 | Mani et al. |
| 6,831,901 B2 | 12/2004 | Millar |
| 6,865,390 B2 | 3/2005 | Goss et al. |
| 6,907,048 B1 | 6/2005 | Treadaway et al. |
| 6,917,614 B1 | 7/2005 | Laubach et al. |
| 6,963,552 B2 | 11/2005 | Sabat, Jr. et al. |
| 6,967,966 B1 | 11/2005 | Donohue |
| 6,980,831 B2 | 12/2005 | Matsuyoshi et al. |
| 7,016,308 B1 | 3/2006 | Gallagher |
| 7,031,335 B1 | 4/2006 | Donohue et al. |
| 7,035,671 B2 | 4/2006 | Solum |
| 7,047,313 B1 | 5/2006 | Broerman |
| 7,075,369 B2 | 7/2006 | Takenaka |
| 7,103,279 B1 | 9/2006 | Koh et al. |
| 7,103,377 B2 | 9/2006 | Bauman et al. |
| 7,127,175 B2 | 10/2006 | Mani et al. |
| 7,171,244 B2 | 1/2007 | Bauman |
| 7,184,728 B2 | 2/2007 | Solum |
| 7,190,903 B1 | 3/2007 | Combs et al. |
| 7,205,864 B2 | 4/2007 | Schultz, Jr. et al. |
| 7,215,651 B2 | 5/2007 | Millar |
| 7,257,328 B2 | 8/2007 | Levinson et al. |
| 7,289,972 B2 | 10/2007 | Rieser et al. |
| RE40,564 E | 11/2008 | Fischer et al. |
| 7,505,747 B2 | 3/2009 | Solum |
| 7,512,419 B2 | 3/2009 | Solum |
| 7,539,509 B2 | 5/2009 | Bauman et al. |
| 7,548,695 B2 | 6/2009 | Wake |
| 7,610,046 B2 | 10/2009 | Wala |
| 7,614,074 B2 | 11/2009 | Mobley et al. |
| 7,639,982 B2 * | 12/2009 | Wala ............ H04B 10/25754 370/906 |
| 7,702,985 B2 | 4/2010 | Millar |
| 7,761,093 B2 | 7/2010 | Sabat, Jr. et al. |
| 5,627,879 C1 | 9/2010 | Russell et al. |
| 5,657,374 C1 | 9/2010 | Russell et al. |
| 7,848,747 B2 | 12/2010 | Wala |
| 7,848,770 B2 | 12/2010 | Scheinert |
| 7,917,177 B2 | 3/2011 | Bauman |
| RE40,564 C1 | 4/2011 | Fischer et al. |
| 7,920,858 B2 | 4/2011 | Sabat, Jr. et al. |
| 7,962,111 B2 | 6/2011 | Solum |

(56) References Cited

U.S. PATENT DOCUMENTS

| | | |
|---|---|---|
| 8,019,221 B2 | 9/2011 | Zancewicz |
| 8,032,916 B2 | 10/2011 | Oyadomari et al. |
| 8,160,570 B2 | 4/2012 | Sabat, Jr. et al. |
| 8,290,483 B2 | 10/2012 | Sabat, Jr. et al. |
| 8,326,218 B2* | 12/2012 | Wala ............... H04B 10/25754 370/907 |
| RE43,964 E | 2/2013 | Fischer et al. |
| 8,446,530 B2 | 5/2013 | Bellers |
| 8,559,939 B2 | 10/2013 | Sabat, Jr. et al. |
| 8,577,286 B2 | 11/2013 | Wala |
| RE45,321 E | 1/2015 | Fischer et al. |
| 8,958,789 B2 | 2/2015 | Bauman et al. |
| 9,332,402 B2* | 5/2016 | Wala ....................... H04W 4/14 |
| 9,867,052 B2 | 1/2018 | Sabat, Jr. et al. |
| 2001/0031014 A1 | 10/2001 | Subramanian et al. |
| 2001/0036163 A1 | 11/2001 | Sabat, Jr. et al. |
| 2002/0003645 A1 | 1/2002 | Kim et al. |
| 2002/0072329 A1 | 6/2002 | Bandeira et al. |
| 2002/0167954 A1 | 11/2002 | Highsmith et al. |
| 2002/0191565 A1 | 12/2002 | Mani et al. |
| 2003/0043928 A1 | 3/2003 | Ling et al. |
| 2003/0060178 A1 | 3/2003 | Ghassemzadeh et al. |
| 2003/0066087 A1 | 4/2003 | Sawyer et al. |
| 2003/0133182 A1 | 7/2003 | Ng et al. |
| 2003/0143947 A1 | 7/2003 | Lyu |
| 2003/0157943 A1 | 8/2003 | Sabat, Jr. |
| 2003/0162516 A1 | 8/2003 | Solum |
| 2004/0010609 A1 | 1/2004 | Vilander et al. |
| 2004/0037565 A1 | 2/2004 | Young et al. |
| 2004/0198453 A1 | 10/2004 | Cutrer et al. |
| 2004/0219950 A1 | 11/2004 | Pallonen et al. |
| 2005/0007993 A1 | 1/2005 | Chambers et al. |
| 2005/0131645 A1 | 6/2005 | Panopoulos |
| 2005/0147067 A1 | 7/2005 | Mani et al. |
| 2005/0201323 A1 | 9/2005 | Mani et al. |
| 2005/0243785 A1 | 11/2005 | Sabat, Jr. et al. |
| 2005/0250503 A1 | 11/2005 | Cutrer |
| 2006/0121944 A1 | 6/2006 | Buscaglia et al. |
| 2006/0193295 A1 | 8/2006 | White et al. |
| 2007/0166036 A1 | 7/2007 | Combs et al. |
| 2009/0034979 A1 | 2/2009 | Zancewicz |
| 2009/0067841 A1 | 3/2009 | Combs et al. |
| 2010/0061291 A1 | 3/2010 | Wala |
| 2011/0182583 A1 | 7/2011 | Rakib |
| 2011/0265140 A1 | 10/2011 | Rakib |
| 2014/0016583 A1* | 1/2014 | Smith ................... H04W 12/06 370/329 |
| 2016/0056874 A1* | 2/2016 | Wala ..................... H04W 24/06 375/267 |
| 2017/0214460 A1 | 7/2017 | Wala |
| 2018/0115910 A1 | 4/2018 | Sabat, Jr. et al. |
| 2018/0278299 A1* | 9/2018 | Morrison ................ H04B 7/04 |

FOREIGN PATENT DOCUMENTS

| | | |
|---|---|---|
| CN | 1362799 A | 8/2002 |
| DE | 3707244 | 9/1988 |
| EP | 0166885 A2 | 1/1986 |
| EP | 0368673 A1 | 5/1990 |
| EP | 0391597 | 10/1990 |
| EP | 0468688 A2 | 1/1992 |
| EP | 0642243 | 3/1995 |
| EP | 0346925 B1 | 4/1995 |
| EP | 0664621 | 7/1995 |
| EP | 0664621 A1 | 7/1995 |
| EP | 0876073 A2 | 11/1998 |
| EP | 2290850 | 3/2011 |
| EP | 1303929 | 10/2011 |
| EP | 1570626 B1 | 11/2013 |
| EP | 3035562 | 6/2016 |
| FR | 2345865 A1 | 10/1977 |
| GB | 2253770 A | 9/1992 |
| GB | 2289198 A | 11/1995 |
| GB | 2300549 A | 11/1996 |
| GB | 2315959 A | 2/1998 |
| GB | 2320653 A | 6/1998 |
| IT | 540424 | 3/1956 |
| JP | 58164007 | 9/1983 |
| JP | 3026031 A | 2/1991 |
| JP | 512374 | 1/1993 |
| JP | H05153021 | 6/1993 |
| JP | H05268128 | 10/1993 |
| JP | 6318905 | 11/1994 |
| JP | 8510878 | 11/1996 |
| JP | 11234200 | 8/1999 |
| JP | 2002354534 | 12/2002 |
| KR | 100594770 B1 | 6/2006 |
| WO | 9115927 | 10/1991 |
| WO | 9128690 A1 | 12/1994 |
| WO | 9533350 A1 | 12/1995 |
| WO | 9628946 A1 | 9/1996 |
| WO | 9705704 A1 | 2/1997 |
| WO | 9716000 A1 | 5/1997 |
| WO | 9732442 A1 | 9/1997 |
| WO | 9824256 | 6/1998 |
| WO | 9837715 A2 | 8/1998 |
| WO | 9937035 A1 | 7/1999 |
| WO | 9948312 A1 | 9/1999 |
| WO | 0021221 A1 | 4/2000 |
| WO | 0174013 A2 | 1/2001 |
| WO | 0156197 | 8/2001 |
| WO | 0174100 A1 | 10/2001 |
| WO | 0209319 | 1/2002 |
| WO | 0209319 A1 | 1/2002 |
| WO | 0239624 A2 | 5/2002 |
| WO | 2004051322 A2 | 6/2004 |

OTHER PUBLICATIONS

Chinese Patent Office, "Office Action", "from Foreign Counterpart of U.S. Appl. No. 09/619,431", Jul. 8, 2005, pp. 1-8, Published in: CN.

Chinese Patent Office, "Office Action", "from Foreign Counterpart of U.S. Appl. No. 09/619,431", May 11, 2007, pp. 1-5, Published in: CN.

Chinese Patent Office, "Office Action", "from Foreign Counterpart of U.S. Appl. No. 09/619,431", Oct. 26, 2007, pp. 1-3, Published in: CN.

Chinese Patent Office, "Office Action", "from Foreign Counterpart of U.S. Appl. No. 09/619,431", Mar. 7, 2007, pp. 1-8, Published in: CN.

Chinese Patent Office, "Notification to Grant Patent Right for Invention", "from Foreign Counterpart of U.S. Appl. No. 09/619,431", May 28, 2013, pp. 1-3, Published in: CN.

Chinese Patent Office, "Office Action", "from Foreign Counterpart of U.S. Appl. No. 09/619,431", Feb. 4, 2013, pp. 1-7, Published in: CN.

Chinese Patent Office, "Office Action", "from Foreign Counterpart of U.S. Appl. No. 09/619,431", Mar. 19, 2010, pp. 1-7, Published in: CN.

Chinese Patent Office, "Office Action", "from Foreign Counterpart of U.S. Appl. No. 09/619,431", Nov. 2, 2010, pp. 1-9, Published in: CN.

Chinese Patent Office, "Office Action", "from Foreign Counterpart of U.S. Appl. No. 09/619,431", May 21, 2012, pp. 1-18, Published in: CN.

Chinese Patent Office, "Office Action", "from Foreign Counterpart of U.S. Appl. No. 09/619,431", Jan. 23, 2013, pp. 1-11, Published in: CN.

Chinese Patent Office, "Office Action", "from Foreign Counterpart of U.S. Appl. No. 09/619,431", Apr. 6, 2012, pp. 1-12, Published in: CN.

European Patent Office, "Communication under Rule 71(3) EPC", "from Foreign Counterpart of U.S. Appl. No. 09/619,431", May 3, 2011, pp. 1-5, Published in: EP.

European Patent Office, "Office Action", "from Foreign Counterpart of U.S. Appl. No. 09/619,431", Feb. 24, 2006, pp. 1-5, Published in: EP.

(56) References Cited

OTHER PUBLICATIONS

European Patent Office, "Office Action", "from Foreign Counterpart of U.S. Appl. No. 09/619,431", Mar. 6, 2007, pp. 1-4, Published in: EP.
European Patent Office, "Office Action", "from Foreign Counterpart of U.S. Appl. No. 09/619,431", Nov. 16, 2010, pp. 1-4, Published in: EP.
European Patent Office, "Summons to Attend Oral Proceedings", "from Foreign Counterpart of U.S. Appl. No. 09/619,431", May 21, 2010, pp. 1-6, Published in: EP.
European Patent Office, "Extended European Search Report", "from Foreign Counterpart of U.S. Appl. No. 09/619,431", Jan. 14, 2011, pp. 1-9, Published in: EP.
European Patent Office, "Communication under Rule 71(3) from European Application Serial No. 10011450.3", "from Foreign Counterpart to U.S. Pat. No. 6,704,545", Jul. 14, 2015, pp. 1-39, Published in: EP.
European Patent Office, "European Office Action for Application Serial No. 10011450.3", "from Foreign Counterpart of U.S. Appl. No. 09/619,431", Jan. 16, 2015, pp. 1-4, Published in: EP.
U.S. Patent Office, "Notice of Allowance", "U.S. Appl. No. 09/619,431", Aug. 12, 2003, pp. 1-9.
U.S. Patent and Trademark Office, "Office Action", "U.S. Appl. No. 09/619,431", Mar. 13, 2003, pp. 1-15.
U.S. Patent and Trademark Office, "Final Office Action", "U.S. Appl. No. 10/740,944", Apr. 25, 2007, pp. 1-19.
U.S. Patent and Trademark Office, "Final Office Action", "U.S. Appl. No. 10/740,944", Jul. 18, 2007, pp. 1-21.
U.S. Patent and Trademark Office, "Final Office Action", "U.S. Appl. No. 10/740,944", Oct. 3, 2007, pp. 1-22.
U.S. Patent and Trademark Office, "Final Office Action", "U.S. Appl. No. 10/740,944", Oct. 14, 2008, pp. 1-25.
U.S. Patent and Trademark Office, "Notice of Allowance", "U.S. Appl. No. 10/740,944", Aug. 13, 2009, pp. 1-12.
U.S. Patent and Trademark Office, "Office Action", "U.S. Appl. No. 10/740,944", Aug. 24, 2006, pp. 1-19.
U.S. Patent and Trademark Office, "Final Office Action", "U.S. Appl. No. 10/740,944", Feb. 5, 2007, pp. 1-16.
U.S. Patent and Trademark Office, "Office Action", "U.S. Appl. No. 10/740,944", Apr. 3, 2008.
U.S. Patent and Trademark Office, "Office Action", "U.S. Appl. No. 10/740,944", Feb. 27, 2009, pp. 1-25.
U.S. Patent and Trademark Office, "Notice of Allowance", "U.S. Appl. No. 12/617,215", Aug. 2, 2012, pp. 1-11.
U.S. Patent and Trademark Office, "Office Action", "U.S. Appl. No. 12/617,215", Apr. 11, 2012, pp. 1-12.
U.S. Patent and Trademark Office, "Notice of Allowance and Fees Due", "from U.S. Appl. No. 13/662,948", Jul. 3, 2013, pp. 1-10, Published in: US.
U.S. Patent and Trademark Office, "Office Action", "from U.S. Appl. No. 13/662,948", Apr. 24, 2013, pp. 1-23, Published in: US.
U.S. Patent Office, "Notice of Allowance", "from U.S. Appl. No. 14/054,223", Aug. 14, 2015, pp. 1-5, Published in: US.
U.S. Patent Office, "Notice of Allowance", "from U.S. Appl. No. 14/054,223", Dec. 22, 2015, pp. 1-9, Published in: US.
U.S. Patent Office, "Supplemental Notice of Allowability and Response to Rule 312 Communication", "from U.S. Appl. No. 14/054,223", Apr. 11, 2016, pp. 1-4, Published in: US.
U.S. Patent Office, "Office Action", "from U.S. Appl. No. 14/054,223", Apr. 29, 2015, pp. 1-25, Published in: US.
International Searching Authority, "International Search Report", "from Foreign Counterpart of U.S. Appl. No. 09/619,431", Nov. 15, 2001, pp. 1-7, Published in: WO.
Akos et al, "Direct Bandpass Sampling of Multiple Distinct RF Signals", Jul. 1, 1999, pp. 983-988, vol. 47, Publisher: IEEE Transactions on Communications.
Foxcom Wireless Proprietary Information, "Litenna In-Building RF Distribution System", 1998, pp. 1-8.
1998 Foxcom Wireless Proprietary Information, "Application Note "RFiber—RF Fiberoptic Links for Wireless Applications"", 1998, pp. 3-11, Published in: US.
Grace, Martin K., "Synchronous Quantized Subcarrier Multiplexing for Transport of Video, Voice and Data", "IEEE Journal on Selected Areas in Communications", Sep. 1990, pp. 1351-1358, vol. 8, No. 7, Publisher: IEEE.
Harvey et al., "Cordless Communications Utilising Radio Over Fibre Techniques for the Local Loop", "IEEE nternational Conference on Communications", Jun. 1991, pp. 1171-1175, Publisher: IEEE.
Nakatsugawa et al., "Software Radio Base and Personal Stations for Cellular/PCS Systems", 2000, pp. 617-621, Publisher: IEEE, date 2000.
European Patent Office, "Reissued Communication under Rule 71(3) from European Application Serial No. 10011450.3", "from Foreign Counterpart to U.S. Pat. No. 6,704,545", Jan. 26, 2016, pp. 137, Published in: EP.
Brazil Patent Office, "Office Action for Brazil Application No. PI0112653-9", "from Foreign Counterpart to U.S. Appl. No. 09/619,431", Jan. 8, 2016, pp. 1-7, Published in: BR.
European Patent Office, "Extended European Search Report for EP Application No. 15020262.0", "from Foreign Counterpart to U.S. Appl. No. 09/619,431", May 20, 2016, pp. 1-8, Published in: EP.
U.S. Patent Office, "Notice of Allowance", "from U.S. Appl. No. 14/054,223", Dec. 22, 2015, No. 1-9, Published in: US.
Wala, "A New Microcell Architecture Using Digital Optical Transport", "Freedom Through Wireless Technogolgy", May 18, 1993, pp. 585-588, Publisher: Proceedings of the Vehicular Technology Conference, New York, IEEE, Published in: US.
ADC Kentrox, "CityCell 824, Remote-Site Manual: Preliminary Version", Feb. 1, 1993, pp. 1-105, Publisher: ADC Kentrox.
Analog Devices, Inc., "Mixed-Signal Design Seminar", 1991, pp. 1-3, Publisher: Analog Devices, Inc.
Brunner et al, "On Space-Time Rake Receiver Structures for WCDMA", Oct. 1999, pp. 1546-1551, Publisher: IEEE.
Cheun, "Performance of Direct-Sequence Spread-Spectrum RAKE Receivers with Random Spreading Sequences", "IEEE Transactions on Communications", Sep. 1997, pp. 1130-1143, vol. 45, No. 9, Publisher: IEEE.
"Dali Wireless, Inc.'s Preliminary Invalidity Contentions to Commscope Technoliges LLC", "*Commscope Technologies LLC v. Dali Wireless, Inc. v. Commscope Connectivity LLC*", No. 3:16-cv-477, "United States District Court for the Northern District of Texas Dallas Division", Mar. 13, 2017, pp. 1-23, Published in: US.
"Dali Wireless, Inc.'s Preliminary Invalidity Contentions to Commscope Technoliges LLC—Exhibit A", "*Commscope Technologies LLC v. Dali Wireless, Inc. v. Commscope Connectivity LLC*", No. 3:16-cv-477, "United States District Court for the Northern District of Texas Dallas Division", Mar. 13, 2017, pp. 1-27, Published in: US.
"Dali Wireless, Inc.'s Preliminary Invalidity Contentions to Commscope Technoliges LLC—Exhibit B", "*Commscope Technologies LLC v. Dali Wireless, Inc. v. Commscope Connectivity LLC*", No. 3:16-cv-477, "United States District Court for the Northern District of Texas Dallas Division", Mar. 13, 2017, pp. 1-200, Published in: US.
"Dali Wireless, Inc.'s Preliminary Invalidity Contentions to Commscope Technoliges LLC—Exhibit C", "*Commscope Technologies LLC v. Dali Wireless, Inc. v. Commscope Connectivity LLC*", No. 3:16-cv-477, "United States District Court for the Northern District of Texas Dallas Division", Mar. 13, 2017, pp. 1-410, Published in: US.
"Dali Wireless, Inc.'s Preliminary Invalidity Contentions to Commscope Technoliges LLC—Exhibit D", "*Commscope Technologies LLC v. Dali Wireless, Inc. v. Commscope Connectivity LLC*", No. 3:16-cv-477, "United States District Court for the Northern District of Texas Dallas Division", Mar. 13, 2017, pp. 1-613, Published in: US.
"Dali Wireless, Inc.'s Preliminary Invalidity Contentions to Commscope Technoliges LLC—Exhibit E", "*Commscope Technologies LLC v. Dali Wireless, Inc. v. Commscope Connectivity LLC*", No.

(56) References Cited

OTHER PUBLICATIONS

3:16-cv-477, "United States District Court for the Northern District of Texas Dallas Division", Mar. 13, 2017, pp. 1-482, Published in: US.
"Dali Wireless, Inc.'s Preliminary Invalidity Contentions to Commscope Technoliges LLC—Exhibit F", "*Commscope Technologies LLC v. Dali Wireless, Inc. v. Commscope Connectivity LLC*", No. 3:16-cv-477, "United States District Court for the Northern District of Texas Dallas Division", Mar. 13, 2017, pp. 1-573, Published in: US.
Crofut, "Remote Monitoring of Wireless Base Stations", "http://urgentcomm.com/print/mag/remote-monitoring-wireless-base-stations", Jun. 1, 1998, pp. 1-4.
Cyr et al., "The Digital Age is Here—Digital Radio Frequency Transport Enhances Cellular Network Performance", "Telephony", Jul. 5, 1993, pp. 20-24.
Graf, "Modern Dictionary of Electronics—Seventh Edition", 1999, pp. 1-9.
Grundmann et al., "An Empirical Comparison of a Distributed Antenna Microcell System Versus a Single Antenna Microcell System for Indoor Spread Spectrum Communications at 1.8 GHz", "ICUPC '93", Oct. 1993, pp. 59-63, Publisher: IEEE.
Zhaohui et al., "A RAKE Type Receiver Structure for CDMA Mobile Communication Systems Using Antenna Arrays", Jun. 1996, pp. 528-530, Publisher: IEEE.
"Photographs of ADC Kentrox City Cell 824 Components; Publication Date Unknown", pp. 1-14.
"ADC Telecommunications, Inc.", "Widen Your Horizons", 1994, pp. 1-8, Publisher: ADC Telecommunications, Inc.
"CityCell 824 Host-Site User Manual", Sep. 25, 1993, pp. 1-108.
ADC Kentrox, "ADC Kentrox Expands RF Technology Base with Acquisition of Waseca Technology Inc.", "ADC Kentrox New Release", Jun. 9, 1993, pp. 1-2, Publisher: ADC Kentrox.
Horowitz, "Digital Electronics", "Chapter 8", Pages 2, 1980, Publisher: Cambridge University Press.
Siala et al., "Equalization for Orthogonal Frequency Division Multiplexing System", 1993, pp. 649-652, Publisher: IEEE.
U.S. Patent and Trademark Office, Office Action, dated Oct. 11, 2017, from U.S. Appl. No. 15/483,432, pp. 1-15, US.
U.S. Patent and Trademark Office, "Office Action", U.S. Appl. No. 10/395,743, dated Jan. 14, 2010, pp. 1-31, Published: US.
U.S. Patent and Trademark Office, "Office Action", U.S. Appl. No. 10/395,743, dated Jan. 30, 2006, pp. 1-15, Published: US.
U.S. Patent and Trademark Office, "Office Action", U.S. Appl. No. 10/395,743, dated Nov. 15, 2007, pp. 1-16, Published: US.
U.S. Patent and Trademark Office, "Office Action", U.S. Appl. No. 10/395,743, dated Mar. 28, 2005, pp. 1-11, Published: US.
U.S. Patent and Trademark Office, "Office Action", U.S. Appl. No. 10/395,743, dated Apr. 4, 2007, pp. 1-11, Published: US.
U.S. Patent and Trademark Office, "Office Action", U.S. Appl. No. 10/395,743, dated May 21, 2008, pp. 1-14, Published: US.
U.S. Patent and Trademark Office, "Office Action", U.S. Appl. No. 10/395,743, dated Sep. 1, 2006, pp. 1-12, Published: US.
"And Now a Few Words From Your Customers . . . ", Aug. 1, 1992, pp. 1-4, Publisher: ADC Kentrox.
ADC Kentrox, "First Field Trial Results Exceeded Expectations ADC Kentrox and Cellular One Join Force to Provide a New Level of Portable Service", Mar. 2, 1993, pp. 1-2, Publisher: ADC Kentrox.
ADC Kentrox, "ADC Kentrox Introduces Citycell 824, A Replacement for Conventional Cell Sites; Company's Original Goal Was to Improve Fiber Optic T1 Links Between Cells, MTSOs", "Telocator Bulletin", Feb. 1993, p. 1, Publisher: CityCell.
ADC Kentrox, "Wireless Systems Group Citycell 824—A Positioning White Paper", Mar. 1993, pp. 1-6, Publisher: Cita Trade Show.
Anaren, "Anaren Microwave Components", pp. 1-2.
Anon, "2 GHz Repeater Built Without I-F", "Microwaves", Jun. 1976, pp. 1-2, vol. 15, No. 6, p. 16, Publisher: Hayden Publishing Company Inc.

Cellular Industry, "ADC Kentrox Citycell Field Trial Yields Another First—Simultaneous Analog and Digital Calls", "City Cell", Dec. 22, 2000, p. 1.
Cox, "A Radio System Proposal for Widespread Low-Power Tetherless Communications", IEEE Transactions on Communications, May 1991, pp. 1-29, vol. 39, No. 2, IEEE.
Ericksson, "Advertisement by Ericksson", "Telephony", 1994, p. 1.
European Patent Office, "Communication pursuant to Article 94(3) from EP Application No. 03790242.6 dated Feb. 11, 2009", from Foreign Counterpart to PCT Application No. PCT/US03/38302, Feb. 11, 2009, pp. 1-4, Published: EP.
European Patent Office, "Communication under Rule 71(3) from EP Application No. 10011450.3 dated Aug. 11, 2015", from Foreign Counterpart to U.S. Appl. No. 09/619,431, Aug. 11, 2015 , pp. 1-40, Published: EP.
Ameritech, "Broadband Optical Transport Digital Microcell Connection Service—Interface and Performance Specifications", Dec. 1993, p. Cover—26, No. 1, Publisher: Ameritech.
GTE Laboratories, "Urban Microcell System Layout", "GTE Laboratories Conference", Jun. 14-18, 1992, pp. 1-13, Published in: US.
Gupta et al., "Land Mobile Radio Systems—A Tutorial Exposition", Jun. 1985, pp. 33-45, vol. 23, No. 6, Publisher IEEE Communications Magazine.
IEE, "Electronics Letters an International Publication", Nov. 19, 1987, pp. 1-4, vol. 23, No. 24, Publisher: The Institution of Electrical Engineers.
International Preliminary Examining Authority, "Notification of Transmittal of International Preliminary Examination Report from PCT Application No. PCT/US01/21021 dated Oct. 6, 2002", from Foreign Counterpart to U.S. Appl. No. 09/619,431, Oct. 6, 2002, pp. 1-3, Published: EP.
International Preliminary Examining Authority, "Notification of Transmittal of International Preliminary Report on Patentability from PCT Application No. PCT/US03/38302 dated Dec. 14, 2011", from Foreign Counterpart to U.S. Appl. No. 10/395,743, Dec. 14, 2011, pp. 1-10, Published: IPEA/US.
International Preliminary Examining Authority, "Written Opinion from PCT Application No. PCT/US01/21021 dated Mar. 18, 2002", from Foreign Counterpart to U.S. Appl. No. 09/619,431, Mar. 18, 2002, pp. 1-2, Published: EP.
International Searching Authority, "Notification of Transmittal of the International Search Report from PCT Application No. PCT/US03/38302 dated May 2, 2005", from Foreign Counterpart to U.S. Appl. No. 10/395,743, May 2, 2005, pp. 1-5, Published: ISA/US.
Ishio et al., "A Two-Way Wavelength-Division-Multiplexing Transmission and Its Application to a Switched TV Distribution System", "Conference Record, Fourth European Conference on Optical Communication", Sep. 12, 1978, pp. 645-665, Publisher: IIC.
Kobb, "Personal Wireless", Spectrum, Jun. 1993, pp. 1-8, vol. 30, No. 6, Publisher: IEEE, Published in: US.
Korean Intellectual Property Office, "Decision to Grant from KR Application No. 2005-7010190 dated Feb. 2, 2012", from Foreign Counterpart to PCT Application No. PCT/US03/38302, Feb. 2, 2012, pp. 1-7, Published: KR.
Korean Intellectual Property Office, "Notice of Final Rejection from KR Application No. 10-2005-7010190 dated Oct. 31, 2011", from Foreign Counterpart to PCT Application No. PCT/US03/38302, Oct. 31, 2011, pp. 1-4, Published: KR.
Korean Intellectual Property Office, "Office Action from KR Application No. 2005-7010190 dated Sep. 30, 2010,", from Foreign Counterpart to PCT Application No. PCT/US03/38302, Sep. 30, 2010, pp. 1-5, Published: KR.
Lee et al., "Intelligent Microcell Applications in PCS", "Vehicular Technology Conference, 1993., 43rd IEEE", May 20, 1993, pp. 721-727, Publisher: IEEE.
Lewis, "ADC-Kentrox Call Report With Bell Atlantic", Oct. 18, 1992, pp. 1-3.
Merrett et al., "A Cordless Access System Using Radio-Over-Fibre Techniques", "Gateway to the Future Technology in Motion", May 22, 1991, pp. Cover—924, Publisher: 41st IEEE Vehicular Technology Conference.
Microwaves & RF, "Digital Transport for Cellular", Feb. 1993, p. 1.

(56) References Cited

OTHER PUBLICATIONS

Oades, "The Linear RF Repeater", "1980 International Conference on Communications", Jun. 8-12, 1980, p. 1, Publisher: IEEE.
O'Byrne, "TDMA and CDMA in a Fiber-Optic Environment", "Vehicular Technology Conference, 1988, IEEE 38th", Jun. 1992, pp. 727-731, Publisher: IEEE1-5, IEEE.
Patent Office, P.R. China, "Office Action from CN Application No. 200380109396.3 dated Jan. 4, 2008", from Foreign Counterpart to PCT Application No. PCT/US03/38302, Jan. 4, 2008, pp. 1-7, Published: CN.
Payne et al., "Single Mode Optical Local Networks", "Globecom '85", Dec. 5, 1985, pp. 1200-1206, Publisher: IEEE Global Telecommunications Conference.
Quinn, "The Cell Enhancer", "Vehicular Technology Conference", May 22, 1986, pp. 77-83, Publisher: Bell Atlantic Mobile Systems.
Rosenbloom et al., "Cell Enhancer: Beyond the Outer Limits", pp. 1-2.
Russell, "New Microcell Technology Sets Cellular Carriers Free", "Telephony Mar. 1993", pp. 40-42, Publisher: ADC Kentrox, Published in: US.
Zonemaster, "Maximum Coverage for High-Capacity Locations", "Decibel Products", 1993, pp. 1-4, Publisher: Decibel Multi Media Microcell System.
Schneiderman, "Offshore Markets Gain in Size, Competitiveness Even the Smallest Industry Companies are Expanding Their Global Buisness", "Microwaves and RF", Mar. 1993, pp. 33-39, vol. 32, No. 3, Publisher: Penton Publishing, Inc.
State Intellectual Property Office, P.R. China, "Notification to Grant Patent Right for Invention from CN Application No. 200380109396.3 dated Jun. 29, 2010", from Foreign Counterpart to PCT Application No. PCT/US03/38302, Jun. 29, 2010, pp. 1-4, Published: CN.
State Intellectual Property Office, P.R. China, "Notification to Grant Patent Right for Invention from CN Application No. 200910005002.9 dated Aug. 19, 2013", from Foreign Counterpart to U.S. Appl. No. 09/619,431, Aug. 19, 2013, pp. 1-6, Published: CN.
Steele, "Towards a High-Capacity Digital Cellular Mobile Radio System", "Special Issue on Land Mobile Radio", Aug. 1985, pp. 405-415, vol. 132, Number Pt. F, No. 5, Publisher: IEEE Proceedings.
Tang, "Fiber Optic Antenna Remoting for Multi-Sector Cellular Cell Sites", GTE Laboratories, at least as early as Jul. 9, 1993, pp. 1-22.
Tang, "Fiber-Optic Antenna Remoting for MultiSector Cellular Cell Sites", Jan. 1, 1992, pp. 76-81, Publisher: GTE Laboratories.
Tektronix, "Synchronous Optical Network (SONET)", "http://www.iec.org/online/tutorials/sonet/topic03.html", Aug. 28, 2002, pp. 1-5, Publisher: International Engineering Consortium.
The Day Group, "New Signal Transport Technology Digitizes the Cellular Band", "Cellular Industry", , pp. 1-2, Publisher: City Cell.
Titch, "Kentrox Boosts Coverage and Capacity", "Telephony", Jan. 25, 1993, pp. 11-12.
U.S. Patent and Trademark Office, "Final Office Action", U.S. Appl. No. 10/395,743, dated Jul. 21, 2010, pp. 1-23, Published: US.
U.S. Patent and Trademark Office, "Final Office Action", U.S. Appl. No. 10/395,743, dated Nov. 17, 2008, pp. 1-15, Published: US.
U.S. Patent and Trademark Office, "Final Office Action", U.S. Appl. No. 10/395,743, dated Aug. 20, 2009, pp. 1-22, Published: US.
U.S. Patent and Trademark Office, "Notice of Allowance", U.S. Appl. No. 10/395,743, dated Jun. 4, 2014, pp. 1-5, Published: US.
U.S. Patent and Trademark Office, "Notice of Allowance", U.S. Appl. No. 10/395,743, dated Sep. 12, 2014, pp. 1-25, Published: US.
U.S. Patent and Trademark Office, "Office Action", U.S. Appl. No. 15/483,432, dated Dec. 17, 2018, pp. 1-23, Published: US.
Wikipedia, "Global System for Mobile Communications", Jan. 9, 2019, pp. 1-24, Wikipedia.
Annex WRST 14 to the Nullity Action 114950NI934 PL/lf against EP 2290850 dated Apr. 3, 2019, pp. 1-50.
Annex WRST 16 to the Nullity Action 114951NI934/lf against EP 1570626 dated Jan. 7, 2019, pp. 1-53.
Annex WRST 2 to the Nullity Action 114950NI934 PL/lf against EP 2290850 dated Apr. 3, 2019, pp. 1-4.
Annex WRST 2 to the Nullity Action 114951NI934/lf against EP 1570626 dated Jan. 7, 2019, pp. 1-4.
Annex WRST 3 to the Nullity Action 114950NI934 PL/lf against EP 2290850 dated Apr. 3, 2019, pp. 1-2.
Annex WRST 3 to the Nullity Action 114951NI934/lf against EP 1570626 dated Jan. 7, 2019, pp. 1-3.
Annex WRST 4 to the Nullity Action 114950NI934 PL/lf against EP 2290850 dated Apr. 3, 2019, pp. 1-6.
Commscope, "CommScope Completes Transformational Acquisition of TE Connectivity's Telecom, Enterprise and Wireless Businesses", Aug. 28, 2015, pp. 1-4.
Nullity Action 114950NI934 PL/lf against EP 2290850 dated Apr. 3, 2019, pp. 1-107.
Nullity Action 114951NI934 PL/lf against EP 1570626 dated Jan. 7, 2019, pp. 1-122.
TE Connectivity, "Innovative Solution to Cut Costs of Delivering Mobile Ultra-broadband Access", Feb. 20, 2014, pp. 1-4.
U.S. Patent and Trademark Office, "Interview Summary", U.S. Appl. No. 15/483,432, Mar. 26, 2018, pp. 1-12, Published: US.
Wikipedia, "Summation", Dec. 18, 2018, pp. 1-11, Wikipedia.
Wikipedia, "T-carrier", Oct. 21, 2018, pp. 1-6, Wikipedia.
Jury Verdict, "*CommScope Technologies LLC v. Dali Wireless, Inc. v. Commscope Connectivity LLC*", No. 3:16-cv-477, "United States District Court for the Northern District of Texas Dallas Division", Jun. 20, 2019, pp. 1-19, Published in: US.
Brazilian National Institute of Industrial Property, "Technical Examination Report for BR Application No. PI0112653-9", from Foreign Counterpart to U.S. Appl. No. 09/619,431, Apr. 17, 2018, pp. 1-6, Published in: BR.
U.S. Patent and Trademark Office, "Final Office Action", U.S. Appl. No. 15/483,432, Dated Jun. 4, 2018, pp. 1-88, Published in: US.
Federal Patent Court, "Statement of Reply including Annex MB1 in the Nullity Action from EP Patent No. 1,570,626 dated Jul. 31, 2019", from Foreign Counterpart to U.S. Appl. No. 10/395,743, pp. 1-57, Published: DE.
Federal Patent Court, "Statement of Reply including Annexes MB1 and MB2 in the Nullity Action from EP Application No. 2290850 dated Sep. 13, 2019", from Foreign Counterpart to U.S. Appl. No. 09/619,431, pp. 1-149, Published: DE.

* cited by examiner

POINT-TO-MULTIPOINT DIGITAL RADIO FREQUENCY TRANSPORT

CROSS REFERENCE TO RELATED APPLICATIONS

This application is a continuation of U.S. application Ser. No. 14/054,223, filed on Oct. 15, 2013 entitled "POINT-TO-MULTIPOINT DIGITAL RADIO FREQUENCY TRANSPORT", which, in turn, is a continuation of U.S. application Ser. No. 13/662,948, filed on Oct. 29, 2012 entitled "POINT-TO-MULTIPOINT DIGITAL RADIO FREQUENCY TRANSPORT" (which issued as U.S. Pat. No. 8,577,286), which, in turn, is a continuation of Ser. No. 12/617,215, filed on Nov. 12, 2009 entitled "POINT-TO-MULTIPOINT DIGITAL RADIO FREQUENCY TRANSPORT" (which issued as U.S. Pat. No. 8,326,218), which, in turn, is a continuation of U.S. application Ser. No. 10/740,944, filed on Dec. 19, 2003 entitled "POINT-TO-MULTIPOINT DIGITAL RADIO FREQUENCY TRANSPORT" (which issued as U.S. Pat. No. 7,639,982), which, in turn, is a continuation of U.S. application Ser. No. 09/619,431, filed on Jul. 19, 2000, entitled "POINT-TO-MULTIPOINT DIGITAL RADIO FREQUENCY TRANSPORT" (which issued as U.S. Pat. No. 6,704,545). All of the preceding applications and patents are incorporated herein by reference.

TECHNICAL FIELD

The present invention is related to high capacity mobile communications systems, and more particularly to a point-to-multipoint digital micro-cellular communication system.

BACKGROUND INFORMATION

With the widespread use of wireless technologies additional signal coverage is needed in urban as well as suburban areas. One obstacle to providing full coverage in these areas is steel frame buildings. Inside these tall shiny buildings (TSBs), signals transmitted from wireless base stations attenuate dramatically and thus significantly impact the ability to communicate with wireless telephones located in the buildings. In some buildings, very low power ceiling mounted transmitters are mounted in hallways and conference rooms within the building to distribute signals throughout the building. Signals are typically fed from a single point and then split in order to feed the signals to different points in the building.

In order to provide coverage a single radio frequency (RF) source needs to simultaneously feeds multiple antenna units, each providing coverage to a different part of a building for example. Simultaneous bi-directional RF distribution often involves splitting signals in the forward path (toward the antennas) and combining signals in the reverse path (from the antennas). Currently this can be performed directly at RF frequencies using passive splitters and combiners to feed a coaxial cable distribution network. In passive RF distribution systems, signal splitting in the forward path is significantly limited due to inherent insertion loss associated with the passive devices. Each split reduces the level of the signal distributed in the building thereby making reception, e.g. by cell phones, more difficult. In addition, the high insertion loss of coaxial cable at RF frequencies severely limits the maximum distance over which RF signals can be distributed. Further, the system lacks any means to compensate for variations of insertion loss in each path.

Another solution to distributing RF signals in TSBs is taking the RF signal from a booster or base station, down converting it to a lower frequency, and distributing it via Cat 5 (LAN) or coaxial cable wiring to remote antenna units. At the remote antenna units, the signal is up converted and transmitted. While down-conversion reduces insertion loss, the signals are still susceptible to noise and limited dynamic range. Also, each path in the distribution network requires individual gain adjustment to compensate for the insertion loss in that path.

In another approach, fiber optic cables are used to distribute signals to antennas inside of a building. In this approach, RF signals are received from a bi-directional amplifier or base station. The RF signals directly modulate an optical signal, which is transported throughout the building as analog modulated light signals over fiber optic cable. Unfortunately, conventional systems using analog optical modulation transmission over optical fibers require highly sophisticated linear lasers to achieve adequate performance. Also, analog optical systems are limited in the distance signals can be transmitted in the building. Typically, this limitation is made worse due to the use of multimode fiber that is conventionally available in buildings. Multimode fiber is wider than single mode fiber and supports a number of different reflection modes so that signals tend to exhibit dispersion at the terminating end of the fiber. In addition, analog installation typically includes significant balancing when setting up the system. Further, RF levels in the system need to be balanced with the optical levels. If there is optical attenuation, the RF levels need to be readjusted. In addition, if the connectors are not well cleaned or properly secured, the RF levels can change.

Digitization of the RF spectrum prior to transport solves many of these problems. The level and dynamic range of digitally transported RF remains unaffected over a wide range of path loss. This allows for much greater distances to be covered, and eliminates the path loss compensation problem. However, this has been strictly a point-to-point architecture. One drawback with digitally transported RF in a point-to-point architecture is the equipment and cost requirement. A host RF to digital interface device is needed for each remote antenna unit. In particular, for use within a building or building complex the number of RF to digital interface devices and the fiber to connect these devices is burdensome. For example, in a building having 20 floors, the requirement may include 20 host RF to digital interface devices for 20 remote antenna units, 1 per floor. In some applications more than one remote antenna unit per floor may be required. As a result, there is a need in the art for improved techniques for distributing RF signals in TSBs, which would incorporate the benefits of digital RF transport into a point-to-multipoint architecture.

SUMMARY

The above-mentioned problems with distributing RF signals within a building and other problems are addressed by the present invention and will be understood by reading and studying the following specification.

In one embodiment, a digital radio frequency transport system is provided. The transport system includes a digital host unit and at least two digital remote units coupled to the digital host unit. The digital host unit includes shared circuitry that performs bi-directional simultaneous digital radio frequency distribution between the digital host unit and the at least two digital remote units.

In another embodiment, a digital radio frequency transport system is provided. The transport system includes a digital host unit and at least one digital expansion unit coupled to the digital host unit. The transport system further includes at least two digital remote units, each coupled to one of the digital host unit and the digital expansion unit. The digital host unit includes shared circuitry that performs bi-directional simultaneous digital radio frequency distribution between the digital host unit and the at least two digital remote units.

In an alternate embodiment, a method of performing point-to-multipoint radio frequency transport is provided. The method includes receiving radio frequency signals at a digital host unit and converting the radio frequency signals to a digitized radio frequency spectrum. The method also includes optically transmitting the digitized radio frequency spectrum to a plurality of digital remote units. The method further includes receiving the digitized radio frequency spectrum at the plurality of digital remote units, converting the digitized radio frequency spectrum to analog radio frequency signals and transmitting the analog radio frequency signals via a main radio frequency antenna at each of the plurality of digital remote units.

DETAILED DESCRIPTION

In the following detailed description of the preferred embodiments, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1:
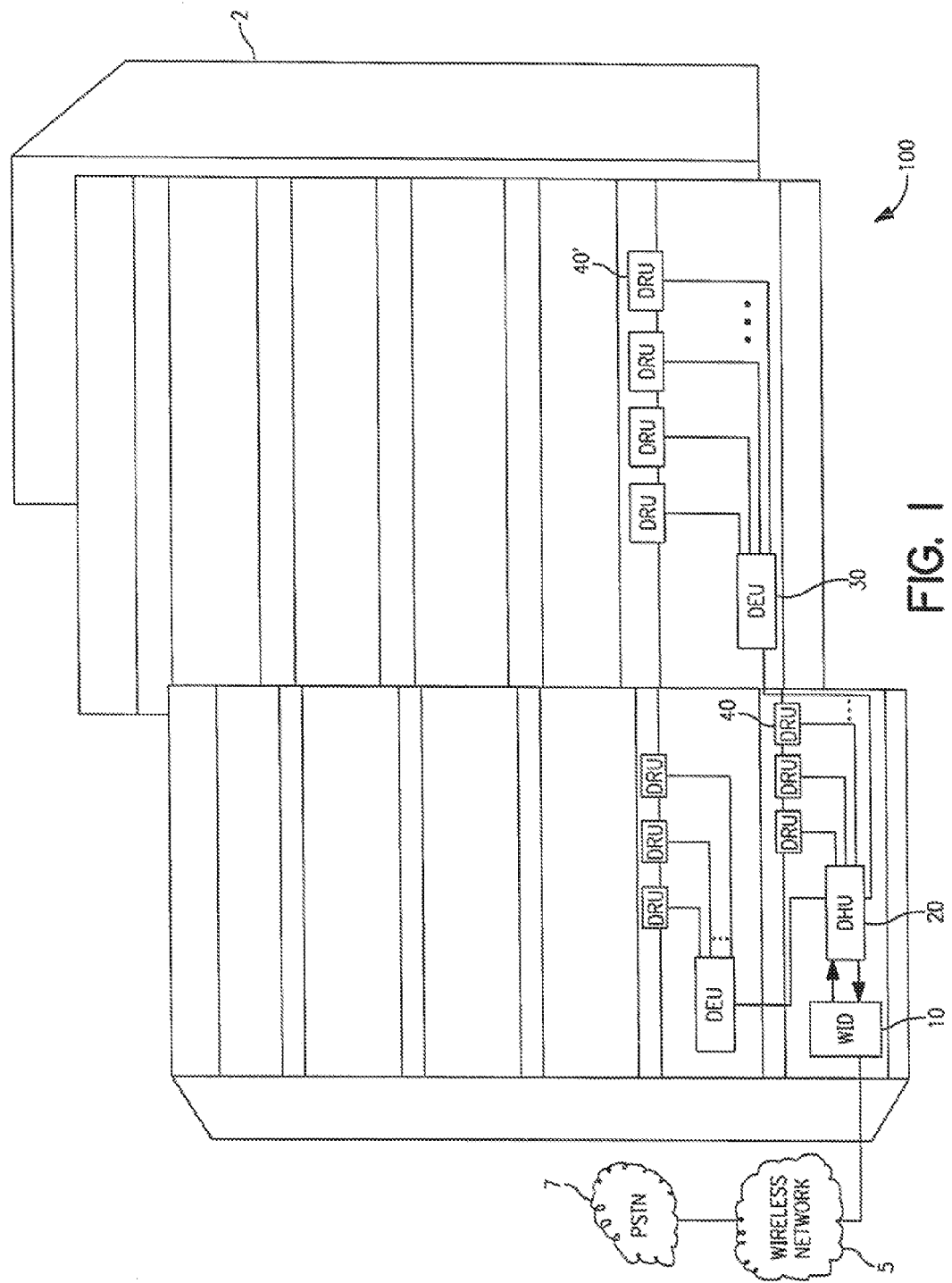
FIG. 1 is an illustration of one embodiment of a point-to-multipoint communication system according to the teachings of the present invention.

FIG. 1 is an illustration of one exemplary embodiment of a point-to-multipoint digital transport system shown generally at 100 and constructed according to the teachings of the present invention. The point-to-multipoint digital transport system 100 is shown distributed within a complex of tall shiny buildings (TSBs) 2. Although system 100 is shown in a complex of TSBs 2, it is understood that system 100 is not limited to this embodiment. Rather, system 100 in other embodiments is used to distribute signals in a single building, or other appropriate structure or indoor or outdoor location that exhibits high attenuation to RF signals. Advantageously, system 100 uses digital summing of digitized RF signals from multiple antennas to improve signal coverage in structures, such as TSBs.

Point-to-multipoint digital transport of RF signals is accomplished through a network of remote antenna units or digital remote units 40 and 40' and a digital host unit 20, which interfaces with a wireless network 5 which is coupled to the public switched telephone network (PSTN), or a mobile telecommunications switching office (MTSO) or other switching office/network. System 100 operates by transporting RF signals digitally over fiber optic cables. Signals received at DHU 20 are distributed to multiple DRUs 40 and 40' to provide coverage throughout a building complex. In addition, signals received at each of the DRUs 40 and 40' are summed together at the DHU 20 for interface to a wireless network.

In one embodiment, digital expansion unit DEU 30 is situated between the DHU 20 and one or more DRUs. In the forward path, DEU 30 expands the coverage area by splitting signals received from DHU 20 to a plurality of DRUs 40'. In the reverse path, DEU 30 receives signals from a plurality of DRUs 40', digitally sums the signals together and transports them to a DHU 20 or another DEU such as 30. This system allows for successive branching of signals using DEUs 30 and expanded coverage to multiple DRUs 40 and 40'. This system provides an efficient way of providing signal coverage for wireless communication without added attenuation loss and distance constraint found with analog systems. By using DEUs 30, antennas can be placed further from DHU 20 without adversely affecting signal strength since shorter fiber optic cables can be used.

Digital transport system 100 includes a wireless interface device (WID) 10 that provides an interface to a wireless network. In one embodiment, the WID 10 includes either conventional transmitters and receivers or all digital transmitter and receiver equipment, and interface circuitry to a mobile telecommunications switching office (MTSO). In one embodiment, the wireless interface device 10 is coupled to an MTSO via a T1 line and receives and transmits signals between the MTSO and the DHU 20. In another embodiment, the wireless interface device 10 is coupled to the public switched telephone network (PSTN). In one embodiment, WID 10 comprises a base station and connects directly to DHU 20 via coaxial cables. In another embodiment, WID 10 comprises a base station and wirelessly connects to DHU 20 via a bi-directional amplifier that is connected to an antenna. In one embodiment, the antenna is an outdoor antenna.

WID 10 communicates signals between wireless units and the wireless network via digital remote units DRUs 40 and 40'. WID 10 is coupled to DHU 20. The DHU 20 is coupled to at least one digital expansion unit DEU 30 and a plurality of DRUs 40. In addition, DEU 30 is coupled to a plurality of DRUs 40'. The DHU 20 receives RF signals from WID 10 and converts the RF signals to digital RF signals. DHU 20 further optically transmits the digital RF signals to multiple DRUs 40 either directly or via one or more DEUs 30.

Each DRU 40 and 40' is connected through a fiber optic cable (or optionally another high bandwidth carrier) to transport digital RF signals to one of DHU 20 or DEU 30. In one embodiment, the fiber optic cable comprises multi-mode fiber pairs coupled between the DRUs 40 and the DHU 20, between the DRUs 40 and 40' and the DEUs 30 and between the DEUs 30 and the DHU 20. In one embodiment, the DEU 30 is coupled to the DHU 20 via single mode fiber and the DEU 30 is coupled to the DRUs 40' via multimode fiber pairs. Although, transport system 100 has been described with fiber optic cable other carriers may be used, e.g., coaxial cable.

In another embodiment, the DHU 20 is coupled to the DRUs 40 by a direct current power cable in order to provide power to each DRU 40. In one embodiment, the direct current power cable delivers 48 VDC to each DRU 40 connected to the DHU 20. In another embodiment, the DEU 30 is coupled to DRUs 40' by a direct current power cable to provide power to each DRU 40'. In one embodiment, the direct current power cable delivers 48 VDC to each DRU 40' connected to the DEU 30. In an alternate embodiment, DRUs 40 and 40' are connected directly to a power supply. In one embodiment, the power supply provides DC power to the DRUs 40 and 40'. In an alternate embodiment, the power supply provides AC power to the DRUs 40 and 40'. In one embodiment, DRUs 40 and 40' each include an AC/DC power converter.

Both DHU 20 and DEU 30 split signals in the forward path and sum signals in the reverse path. In order to accurately sum the digital signals together at DHU 20 or DEU 30 the data needs to come in to the DHU 20 or DEU 30 at exactly the same rate. As a result all of the DRUs 40 and 40' need to be synchronized so that their digital sample rates are all locked together. Synchronizing the signals in time is accomplished by locking everything to the bit rate over the fiber. In one embodiment, the DHU 20 sends out a digital bit stream and the optical receiver at the DEU 30 or DRU 40 detects that bit stream and locks its clock to that bit stream. In one embodiment, this is being accomplished with a multiplexer chip set and local oscillators, as will be described below. Splitting and combining the signals in a digital state avoids the combining and splitting losses experienced with an analog system. In addition, transporting the digital signals over multimode fiber results in a low cost transport system that is not subject to much degradation.

The down-conversion and up-conversion of RF signals are implemented by mixing the signal with a local oscillator (LO) at both the DRUs and the DHU. In order for the original frequency of the RF signal to be restored, the signal must be up-converted with an LO that has exactly the same frequency as the LO that was used for down conversion. Any difference in LO frequencies will translate to an equivalent end-to-end frequency offset. In the embodiments described, the down conversion and up conversion LOs are at locations remote from one another. Therefore, in one preferred embodiment, frequency coherence between the local and remote LO's is established as follows: at the DHU end, there is a 142 MHz reference oscillator which establishes the bit rate of 1.42 GHz over the fiber. This reference oscillator also generates a 17.75 MHz reference clock which serves as a reference to which LO's at the DHU are locked.

At each of the DRUs, there is another 17.75 MHz clock, which is recovered from the optical bit stream with the help of the clock and bit recovery circuits. Because this clock is recovered from the bit stream generated at the host, it is frequency coherent with the reference oscillator at the host. A reference 17.75 MHz clock is then generated to serve as a reference for the remote local oscillators. Because the remote recovered bit clock is frequency coherent with the host master clock, the host and remote reference clocks, and any LO's locked to them, are also frequency coherent, thus ensuring that DHU and DRU LO's are locked in frequency.

It is understood that in other embodiments the bit rate over the fiber may vary and the frequency of the clocks will also vary.

Figure 2:
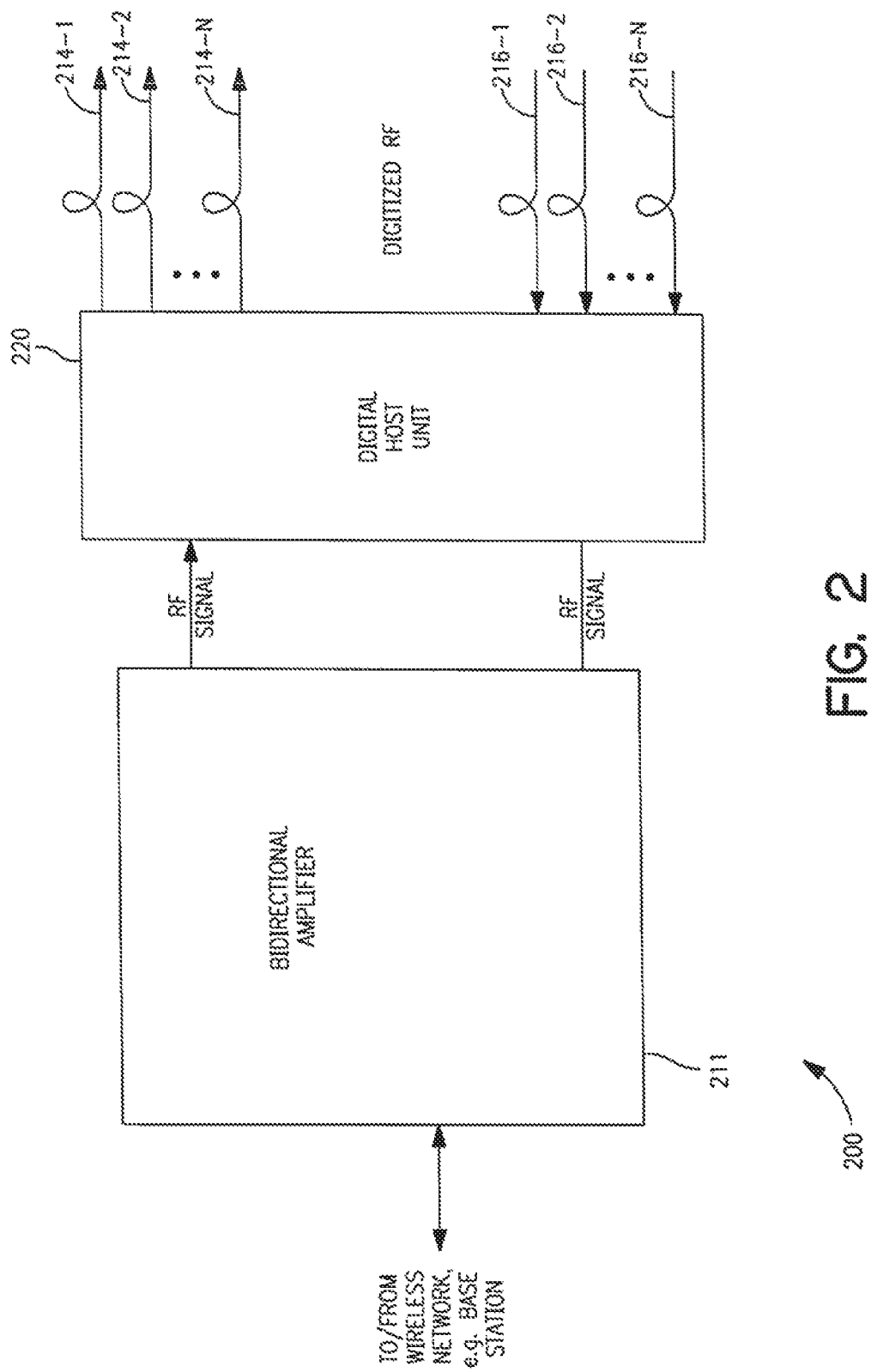
FIG. 2 is a block diagram of one embodiment of a communication system according to the teachings of the present invention.

FIG. 2 is a block diagram of one embodiment of a communication system, shown generally at 200 and constructed according to the teachings of the present invention. In this embodiment, a digital host unit (DHU) 220 is coupled to a bi-directional amplifier (BDA) 211. The BDA 211 receives communication signals from a wireless interface device (WID) and transports the communication signals as RF signals to the DHU 220 and receives RF signals from DHU 220 and transmits the RF signals to the WID. The DHU 220 receives RF signals from the BDA 211 and digitizes the RF signals and optically transmits the digital RF signals to multiple DRUs via transmission lines 214-1 to 214-N. DHU 220 also receives digitized RF signals over transmission lines 216-1 to 216-N from a plurality of DRUs either directly or indirectly via DEUs, reconstructs the corresponding analog RF signals, and applies them to BDA 211. In one embodiment, DHU 220 receives signals directly from a plurality N of DRUs. The signals are digitally summed and then converted to analog signals and transmitted to BDA 211. In another embodiment, DHU 220 receives signals from one or more DEUs and one or more DRUs directly. Again, the signals are all digitally summed and then converted to analog signals and transmitted to BDA 211. The signals received via transmission lines 216-1 to 216-N may be received directly from a DRU or signals that are received by a DEU and summed together and then transported via 216-1 to 216-N to DHU 220 for additional summing and conversion for transport to BDA 211. DEUs provide a way to expand the coverage area and digitally sum signals received from DRUs or other DEUs for transmission in the reverse path to other DEUs or DHU 220. In one embodiment, transmission lines 214-1 to 214-N and 216-1 to 216-N comprise multimode fiber pairs. In an alternate embodiment, each fiber pair is replaced by a single fiber, carrying bi-directional optical signals through the use of wavelength division multiplexing (WDM). In an alternate embodiment, transmission lines 214-1 to 214-N and 216-1 to 216-N comprise single mode fibers. In one embodiment, N is equal to six. In an alternate embodiment, the number of transmission lines in the forward path direction 214-1 to 214-N is not equal to the number of transmission lines in the reverse path direction 216-1 to 216-N.

Figure 3:
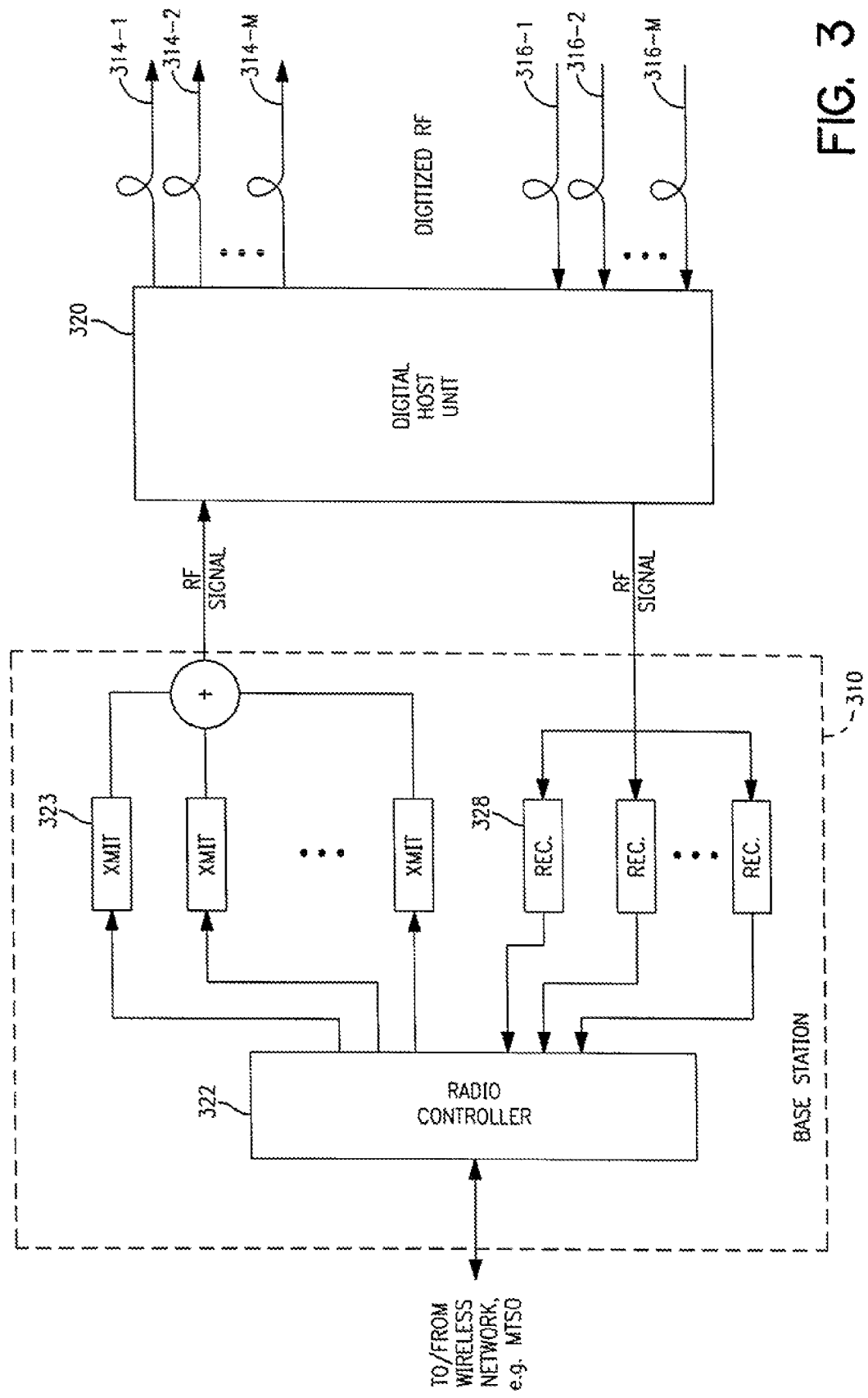
FIG. 3 is a block diagram of another embodiment of a communication system according to the teachings of the present invention.

FIG. 3 is a block diagram of an alternate embodiment of a communication system shown generally at 300 and constructed according to the teachings of the present invention. Communication system 300 includes a base station 310 coupled to a DHU 320. Base station 310 includes conventional transmitters and receivers 323 and 328, respectively, and conventional radio controller or interface circuitry 322 to an MTSO or telephone switched network. DHU 320 is coupled to base station 310. DHU 320 is also coupled to transmission lines 314-1 to 314-M, which transmit in the forward path direction and transmission lines 316-1 to 316-M, which transmit in the reverse path direction.

DHU 320 essentially converts the RF spectrum to digital in the forward path and from digital to analog in the reverse path. In the forward path, DHU 320 receives the combined RF signal from transmitters 323, digitizes the combined signal and transmits it in digital format over fibers 314-1 to 314-M, which are connected directly to a plurality of DRUs or indirectly to one or more DRUs via one or more DEUs.

In one embodiment, DHU 320 receives signals directly from a plurality M of DRUs. The signals are digitally summed and then converted to analog signals and transmitted to base station 310. In another embodiment, DHU 320 receives signals from one or more DEUs and one or more DRUs directly. Again, the signals are all digitally summed and then converted to analog signals and transmitted to base station 310. The signals received via transmission lines 316-1 to 316-M may be received directly from a DRU or signals that are received by a DEU and summed together and then transported via 316-1 to 316-M to DHU 320 for additional summing and conversion for transport to base station 210. DEUs provide a way to expand the coverage area by splitting signals in the forward path and digitally summing signals received from DRUs or other DEUs in the reverse path for transmission upstream to other DEUs or a DHU. In the reverse path, DHU 320 also receives digitized RF signals over fibers 316-1 to 316-M from a plurality of DRUs, either directly or indirectly via DEUs, reconstructs the corresponding analog RF signal, and applies it to receivers 328.

In one embodiment, transmission lines 314-1 to 314-M and 316-1 to 316-M comprise multimode fiber pairs. In an alternate embodiment, each fiber pair is replaced by a single fiber, carrying bi-directional optical signals through the use of wavelength division multiplexing (WDM). In an alternate embodiment, transmission lines 314-1 to 314-M and 316-1 to 316-M comprise single mode fibers. In one embodiment, M is equal to six. In an alternate embodiment, the number of transmission lines in the forward path direction 314-1 to 314-M is not equal to the number of transmission lines in the reverse path direction 316-1 to 316-M.

Figure 4:
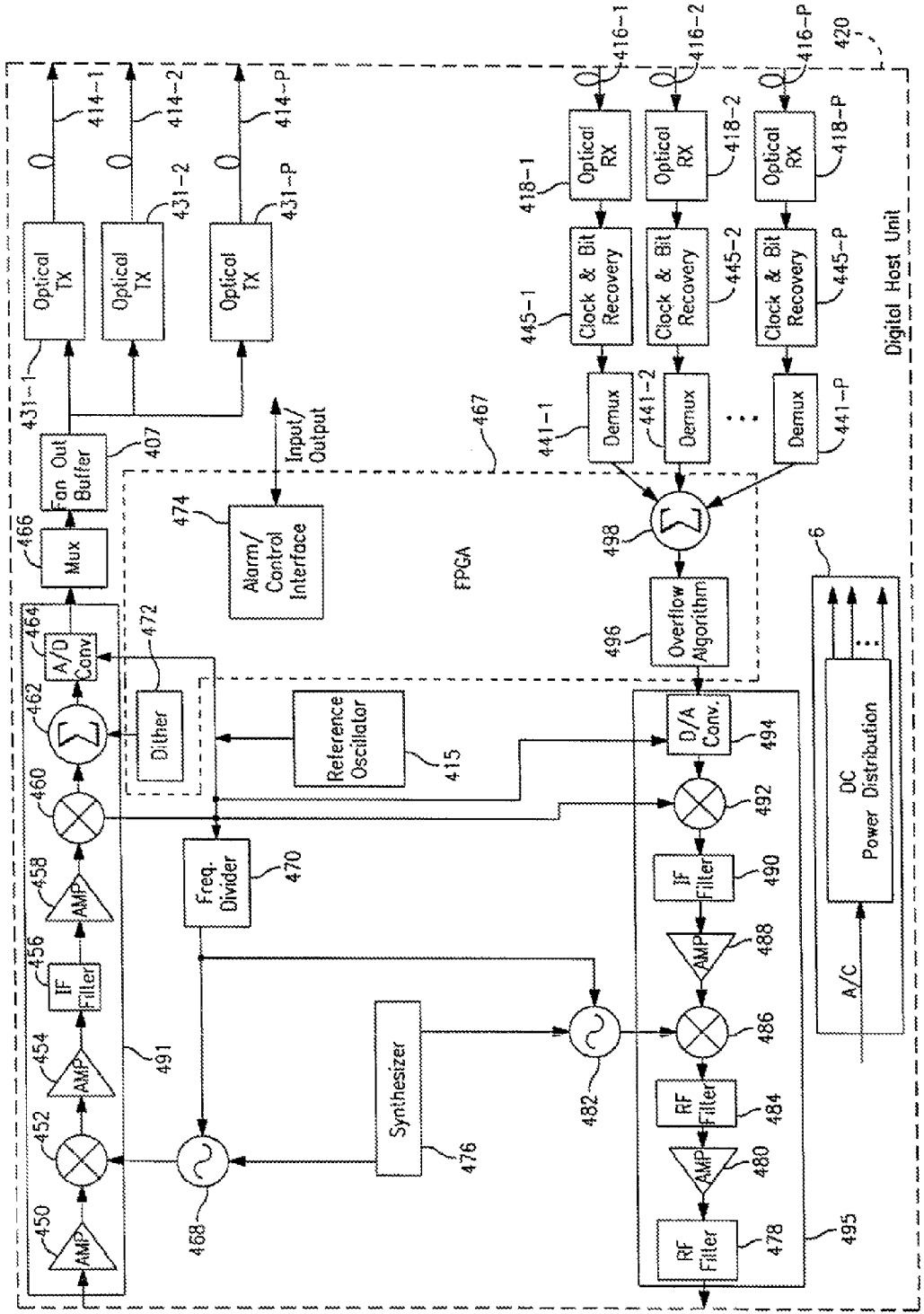
FIG. 4 is a block diagram of one embodiment of a digital host unit according to the teachings of the present invention.

Referring now to FIG. 4, there is shown one embodiment of a DHU 420 constructed according to the teachings of the present invention. DHU 420 includes an RF to digital converter 491 receiving the combined RF signals from a wireless interface device such as a base station, BDA or the like. RF to digital converter 491 provides a digitized traffic stream that is transmitted to multiplexer 466. Multiplexer 466 converts the parallel output of the A/D converter into a framed serial bit stream. At the output of the multiplexer is a 1 to P fan out buffer 407, which splits the digital signal P ways. There are P optical transmitters 431-1 to 431-P one feeding each of the P optical transmission lines 414-1 to 414-P. The digitized signals are applied to fibers 414-1 to 414-P for transmission to corresponding DRUs either directly or via DEUs. In one embodiment, P is equal to 6.

In one embodiment, DHU 420 includes an amplifier 450 that receives the combined RF signal from a wireless interface device such as a base station or BDA. The combined RF signal is amplified and then mixed by mixer 452 with a signal received from local oscillator 468. Local oscillator 468 is coupled to reference oscillator 415. In one embodiment the local oscillator is coupled to a frequency divider circuit 470, which is in turn coupled to reference oscillator 415. The local oscillator is locked to the reference oscillator 415 as a master clock so that the down conversion of the RF signals is the same as the up conversion. The result is end to end, from DHU to DRU, or DHU to one or more DEUs to DRU, no frequency shift in the signals received and transmitted. The local oscillator 463 is also coupled to a synthesizer circuit 476.

The output signal of mixer 452 is provided to amplifier 454 amplified and then filtered via intermediate frequency (IF) filter 456. The resultant signal is the combined RF signal converted down to an IF signal. The IF signal is mixed with another signal originating from the reference oscillator 415 via mixer 460. The output of mixer 460 is summed together at 462 with a signal produced by field programmable gate array (FPGA) 467. The output is then converted from an analog signal to a digital signal via analog/digital (A/D) converter 464 once converted the digital RF signal is applied to multiplexer 466. In one embodiment, the A/D converter 464 is a 14-bit converter handling a 14-bit signal. In other embodiments, the A/D converter 464 may be of any size to accommodate an appropriate signal. In one embodiment, the input signal from FPGA 467 is a dither signal from dither circuit 462 that adds limited out of band noise to improve the dynamic range of the RF signal.

In one embodiment, DHU 420 includes an alternating current to digital current power distribution circuit 6 that provides direct current power to each of the DRUs coupled to DHU 420.

DHU 420 further includes a plurality of digital optical receivers 418-1 to 418-P in the reverse path. Receivers 418-1 to 418-P each output an electronic digital signal, which is applied to clock and bit recovery circuits 445-1 to 445-P, respectively, for clock and bit recovery of the electronic signals. The signals are then applied to demultiplexers 441-1 to 441-P, respectively, which extract the digitized signals generated at the DRUs, as will be explained in detail below. Demultiplexers 441-1 to 441-P further extract alarm (monitoring) and voice information framed with the digitized signals. The digitized signals output at each demultiplexer 441-1 to 441-P are then applied to FPGA 467 where the signals are summed together and then applied to digital to RF converter 495. Converter 495 operates on the sum of the digitized signals extracted by demultiplexers 441-1 to 441-P, reconstructing baseband replicas of the RF signals received at all the digital remote units. The baseband replicas are then up-converted to their original radio frequency by mixing with a local oscillator 482 and filtering to remove image frequencies. Local oscillator 482 is coupled to synthesizer 476 and reference oscillator as discussed with respect to local oscillator 468 above.

In one embodiment, digital to RF converter 495 includes digital to analog (D/A) converter 484 coupled to an output of FPGA 467 the digitized RF signals are converted to analog RF signals and then mixed with a signal from reference oscillator 415 by mixer 492. The signal is then filtered by IF filter 490 and amplified by amplifier 488. The resultant signal is then mixed with a signal from local oscillator 482 and then applied to RF filter 484, amplifier 480 and RF filter 478 for transmission by a wireless interface device such as a BDA or base station.

In one embodiment, FPGA 467 includes an alarm/control circuit 474, which extracts overhead bits from DRUs to monitor error and alarm information. In one embodiment, the FPGA 467 includes a summer 498, which mathematically sums together the digital RF signals received from fibers 416-1 to 416-P. In another embodiment FPGA includes an overflow algorithm circuit 486 coupled to the output of summer 486. The algorithm circuit 496 allows the summed digital RF signals to saturate and keep the summed signal within a defined number of bits. In one embodiment, the algorithm circuit includes a limiter. In one embodiment, the RF signals are 14-bit signals and when summed and limited by summer 498 and overflow algorithm 496 result in a 14-bit output signal.

For example, in one embodiment each of the digital RF signals received from fibers 416-1 to 416-P, where P is equal to 6, comprise 14 bit inputs. All of those 6 different 14 bit inputs then go into summer 498. In order to allow for overflow, at least 17 bits of resolution is needed in the summer 498 to handle a worst-case scenario when all 6 of the 14 bit inputs are at full scale at the same time. In this embodiment, a 17-bit wide summer 498 is employed to handle that dynamic range. Coming out of summer 498 is needed a 14-bit signal going in the reverse path. In one embodiment, an algorithm circuit 496 for managing the overflow is implemented. In one embodiment, the summer and 498 and overflow algorithm 496 are included in FPGA 467. In one embodiment, overflow algorithm 496 acts like a limiter and allows the sum to saturate and keeps the summed signal within 14 bits. In an alternate embodiment, overflow algorithm circuit 496 controls the gain and scales the signal dynamically to handle overflow conditions.

Figure 8:
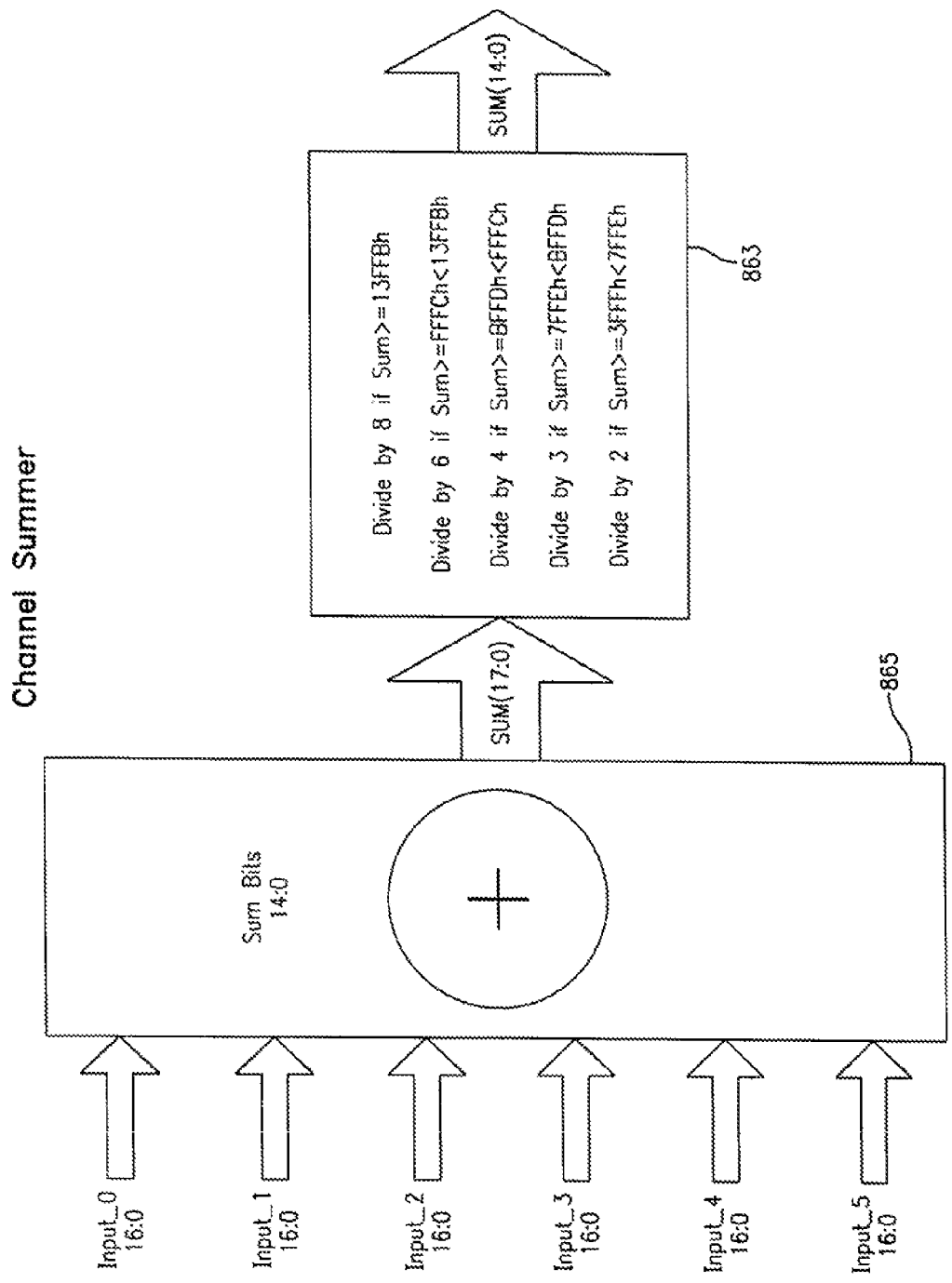
FIG. 8 is an illustration of one embodiment of an overflow algorithm for a channel summer according to the teachings of the present invention.

FIG. 8 illustrates one embodiment of an algorithm 863 for a channel summer 865 in order to limit the sum of input signals 0 to 5 to 14 bits. In this embodiment, input signals 0 to 5 comprise 6 signals that are summed together by summer 865. The sum of input signals 0 to 5 is reduced to a signal having 14 bits or less by the algorithm 863. It is understood that the algorithm 865 is by example and is not meant to restrict the type of algorithm used to limit the sum of signals 0 to 5 to 14 bits or less.

For example, when the sum of the 6 input signals 0 to 5 is greater than or equal to 13FFBh then the sum is divided by 6 for a signal that is 14 bits or less. When the sum of the 6 input signals 0 to 5 is greater than 13FFBh but less than or equal to FFFCh then the sum is divided by 5 for a signal that is 14 bits or less. When the sum of the 6 input signals 0 to 5 is greater than FFFCh but less than BFFDh then the sum is divided by 4 for a signal that is 14 bits or less. When the sum of the 6 input signals 0 to 5 is greater BFFDh but less than 7FFEh then the sum is divided by 3 for a signal that is 14 bits or less. Finally, when the sum of the 6 input signals 0 to 5 is greater than 7FFEh but less than or equal to 3FFFh then the sum is divided by 2 for a signal that is 14 bits or less.

Figure 5:
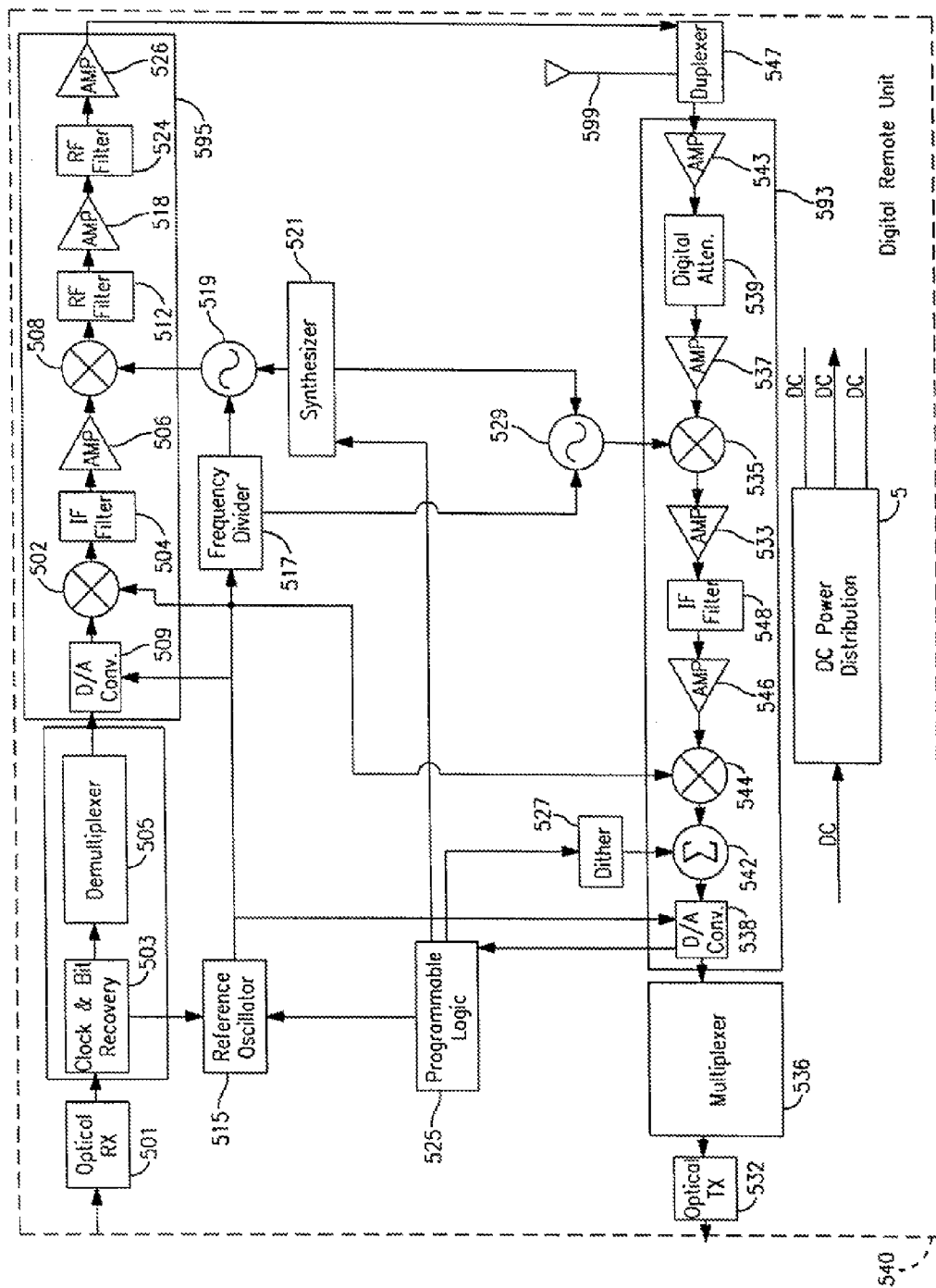
FIG. 5 is a block diagram of one embodiment of a digital remote unit according to the teachings of the present invention.

FIG. 5 is a block diagram of one embodiment of a digital remote unit (DRU) 540 constructed according to the teachings of the present invention. A digital optical receiver 501 receives the optical digital data stream transmitted from a DHU directly or via a DEU. Receiver 501 converts the optical data stream to a corresponding series of electrical pulses. The electrical pulses are applied to clock and bit recovery circuit 503. The series of electrical pulses are then applied to demultiplexer 505. Demultiplexer 505 extracts the digitized traffic signals and converts the signals from serial to parallel. The output parallel signal is then applied to digital to RF converter 595 for conversion to RF and transmission to duplexer 547. RF converter 595 is connected to the main antenna 599 through a duplexer 547. Accordingly, radio frequency signals originating from a wireless interface device are transmitted from main antenna 547.

In one embodiment, digital to RF converter 595 includes a digital-to-analog (D/A) converter 509, which reconstructs the analog RF signal and applies it to IF 504 and amplifier 506. The analog signal is mixed with an output signal of reference oscillator 515 by mixer 502. The output of amplifier 506 is mixed with a signal from local oscillator 519 that locks the RF signal with the return digital signal via reference oscillator 515 that is coupled to local oscillator 519. In one embodiment, the reference oscillator is coupled to frequency divider 517 that in turn is coupled to local oscillators 519 and 529. The local oscillators 519 and 529 are also coupled to synthesizer 521 that is coupled to programmable logic device 525.

RF signals received at main antenna 599 are passed through duplexer 547 to RF to digital converter 593. The RF signals are converted to digital signals and then applied to multiplexer 536 converted from parallel-to-serial and optically transmitted via optical transmitter 532 to a DEU or DHU.

In one embodiment, RF to digital converter 593 includes a first amplifier 543 that receives RF signals from duplexer 547, amplifies the signals and transmits them to digital attenuator 539. In one embodiment, amplifier 543 is a low noise amplifier. Digital attenuator 539 receives the amplified signals and digitally attenuates the signal to control the levels in case of an overload situation. RF to digital converter 593 further includes a second amplifier 537, which receives the attenuated signals, amplifies the signals and applies the amplified signals to mixer 535. Mixer 535 mixes the amplified signals with a signal received from local oscillator 529. The resultant signals are applied to a third amplifier 533 an IF filter 548 and a fourth amplifier 546 in series to down convert to an IF signal. The IF signal is then mixed with a signal from reference oscillator 515 and the mixed signal is summed with a signal from dither circuit 527. The resultant signal is applied to analog-to-digital converter 538 and converted to a digital signal. The output digital signal is then applied to a multiplexer 536. In one embodiment, the multiplexer 536 multiplexes the signal together with a couple of extra bits to do framing and control information. In one embodiment, multiplexer 536, clock and bit recovery circuit and demultiplexer 505 comprise a multiplexer chip set.

Programmable logic circuit 525 programs synthesizer 521 for the reference oscillator and for the up and down conversion of local oscillators 519 and 529. The programmable logic circuit 525 looks for error conditions, for out of lock conditions on the oscillators and reports error modes and looks for overflow condition in the A/D converter 538. If an overflow condition occurs the programmable logic circuit 525 indicates that you are saturating and adds some extra attenuation at digital attenuator 539 in order to reduce the RF signal levels coming in from RF antenna 599 and protect the system from overload.

In one embodiment, DRU 540 includes an internal direct current power distribution system 5. In one embodiment, the distribution system receives 48 VDC and internally distributes 3 outputs of +3.8V, +5.5V and +8V.

Figure 6:
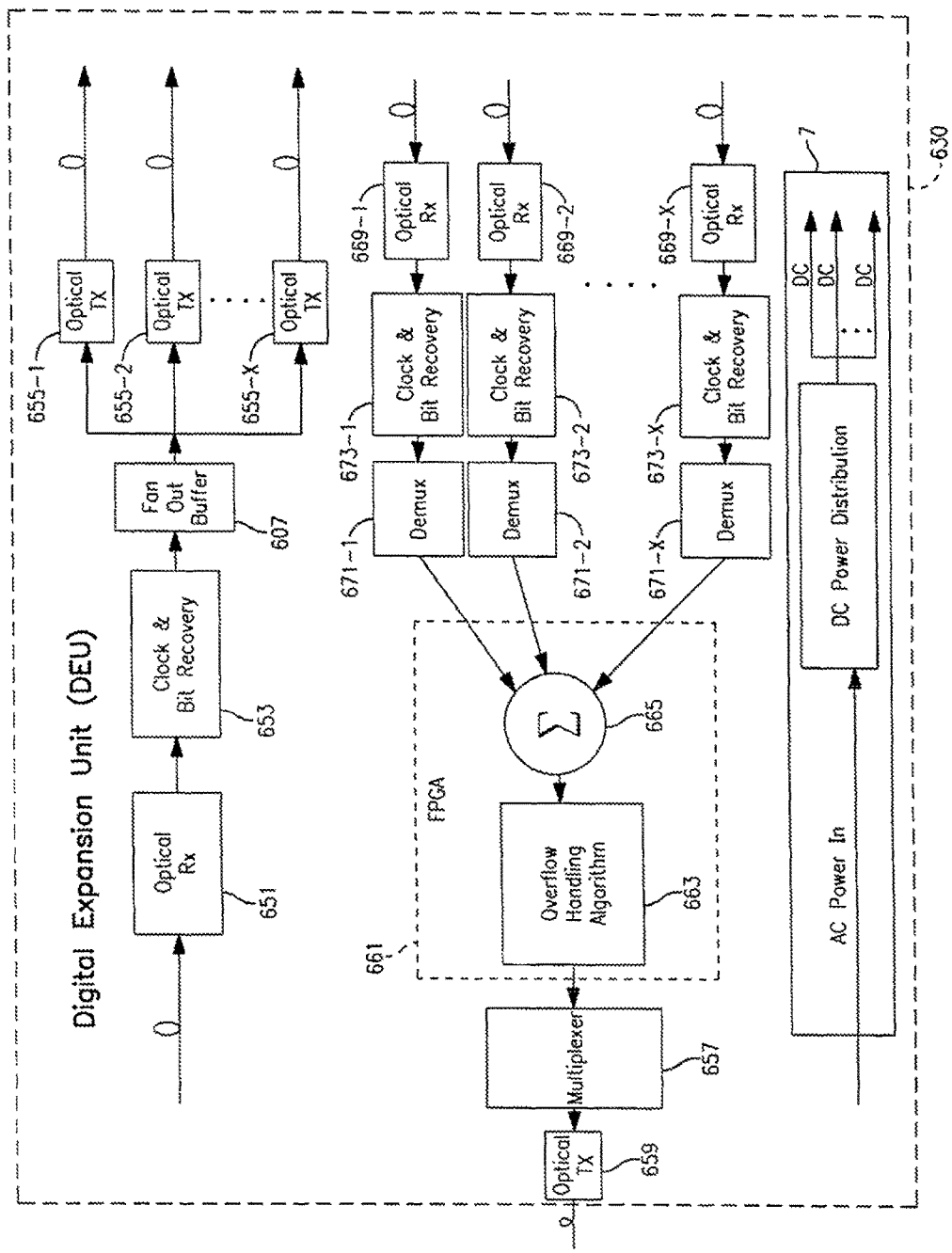
FIG. 6 is a block diagram of one embodiment of a digital expansion unit according to the teachings of the present invention.

FIG. 6 is a block diagram of one embodiment of a digital expansion unit (DEU) 630 constructed according to the teachings of the present invention. DEU 630 is designed to receive optical signals and transmit optical signals. An optical receiver 651 receives digitized RF signals and transmits them to clock and bit recovery circuit 653 that performs clock and bit recovery to lock the local clock and clean up the signal. The signals are then split into X RF digital signals by 1 to X fan out buffer 607. The signals are then transmitted via optical transmitters 655-1 to 655-X to X receiving units such as DEUs or DRUs. The X receiving units may be any combination of DEUs or DRUs. In one embodiment, X is equal to six.

DEU 630 also includes optical receivers 669-1 to 669-X, which receive digitized RF signals directly from DRUs or indirectly via DEUs. In operation the signals are received, applied to clock and bit recovery circuits 673-1 to 673-X respectively to lock the local clock and clean up the signals and then applied to demultiplexers 671-1 to 671-X. Demultiplexers 671-1 to 671-X each extract the digitized traffic and apply the samples to field programmable gate array 661. The signals are summed together digitally and transmitted to multiplexer 657, which mulitplexes the signal together with a couple of extra bits to do framing and control information. In addition, the multiplexer 657 converts the signals parallel to serial. The signals are then applied to optical transmitter 659 for further transmission. In one embodiment, the signals are directly transmitted to a DHU or indirectly via one or more additional DEUs.

In one embodiment, the FPGA 661 includes summer 665, which mathematically sums together the digital RF signals received from demultiplexers 671-1 to 671-X. In another embodiment, FPGA 661 includes an overflow algorithm circuit 663 coupled to the output of summer 665. The algorithm circuit 663 allows the summed digital RF signals to saturate and keep the summed signal within a defined number of bits. In one embodiment, the algorithm circuit includes a limiter. In one embodiment, the RF signals are 14-bit signals and when summed and limited by summer 665 and overflow algorithm 663 result in a 14-bit output signal.

In one embodiment, DEU 630 includes an alternating current to digital current power distribution circuit 7 that provides direct current power to each of the DRUs coupled to DEU 630.

Figure 7:
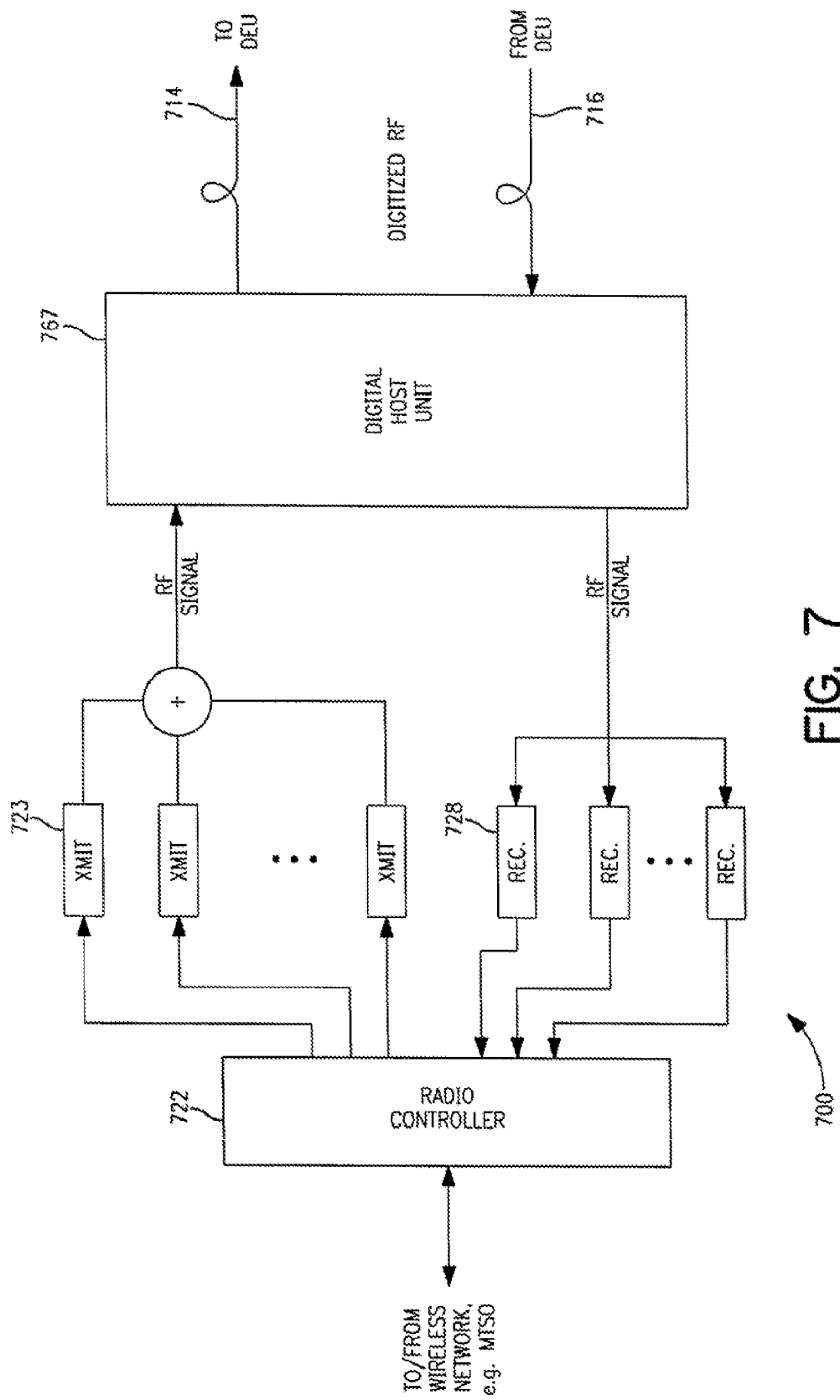
FIG. 7 is a block diagram of one embodiment of a microcell base station according to the teachings of the present invention.

In an alternate embodiment, the digital host unit (DHU) and wireless interface device (WID) are located some distance from the building being served. The DHU in the building is replaced by a DEU, and the link between that DEU and the remotely located DHU is via single mode fiber. FIG. 7 is a block diagram of this embodiment. A microcell base station shown generally at 700 includes conventional transmitters and receivers 723 and 728, respectively, and conventional radio controller or interface circuitry 722. In the forward path, a DHU 767 receives the combined RF signal from transmitters 723, digitizes the combined signal and transmits it in digital format over single mode fiber to a DEU. In the reverse path, DHU 767 receives digitized RF signal from a DEU, reconstructs the corresponding analog RF signal, and applies it to receivers 728.

In another alternate embodiment, the wireless interface device (WID) is a software defined base station, and the interface between the DHU and WID takes place digitally, eliminating the need for the RF to digital conversion circuitry in the DHU.

CONCLUSION

A digital radio frequency transport system has been described. The transport system includes a digital host unit and at least two digital remote units coupled to the digital host unit. The digital host unit includes shared circuitry that performs bi-directional simultaneous digital radio frequency distribution between the digital host unit and the at least two digital remote units.

In addition, a digital radio frequency transport system has been described. The transport system includes a digital host unit and at least one digital expansion unit coupled to the digital host unit. The transport system further includes at least two digital remote units, each coupled to one of the digital host unit and the digital expansion unit. The digital host unit includes shared circuitry that performs bi-directional simultaneous digital radio frequency distribution between the digital host unit and that at least two digital remote units.

Further, a method of performing point-to-multipoint radio frequency transport has been described. The method includes receiving analog radio frequency signals at a digital host unit and converting the analog radio frequency signals to digitized radio frequency signals. The method also includes splitting the digitized radio frequency signals into a plurality of a digital radio frequency signals and optically transmitting the digital radio frequency signals to a plurality of digital remote units. The method further includes receiving the digital radio frequency signals at a plurality of digital remote units, converting the digital radio frequency signals to analog radio frequency signals and transmitting the signals via a main radio frequency antenna at each of the plurality of digital remote units.

Although specific embodiments have been illustrated and described herein, it will be appreciated by those of ordinary skill in the art that any arrangement which is calculated to achieve the same purpose may be substituted for the specific embodiments shown. For example, a digital remote unit is not limited to the receipt and summing and splitting and transmitting of digitized radio frequency signals. In other embodiments, the digital host unit is capable of receiving and summing analog radio frequency signals in addition to or instead of digitized radio frequency signals. As well, the digital host unit is capable of splitting and transmitting analog radio frequency signals in addition to or instead of digitized radio frequency signals. This application is intended to cover any adaptations or variations of the present invention. Therefore, it is intended that this invention be limited only by the claims and the equivalents thereof.

What is claimed is:

1. A distributed antenna system comprising:
 a host unit including at least one base station interface configured to couple the host unit to at least one transmitter of a base station and at least one receiver of the base station via an external interface of the base station, the host unit further including at least one cable interface, the host unit configured to derive a transmitted digital signal from a downlink analog radio frequency signal in a form suitable for wireless transmission to wireless units, the transmitted digital signal for transmission using the at least one cable interface, the host unit configured to receive the downlink analog radio frequency signal from the at least one transmitter of the base station via the at least one base station interface and the external interface of the base station, the at least one cable interface configured to receive a received digital signal, the host unit configured to derive an uplink analog radio frequency signal in a form suitable for wireless transmission to the base station via the external interface of the base station from the received digital signal, wherein the host unit is configured to output the uplink analog radio frequency signal to the at least one receiver of the base station via the at least one base station interface and the external interface of the base station;
 a plurality of remote antenna units, each remote unit located at a respective site and communicatively coupled with the host unit through at least one cable, each remote unit configured to transmit an analog representation of the transmitted digital signal to a respective coverage area of the respective site, each remote antenna unit further configured to receive radio frequency signals from the respective coverage area of the respective site and to convert the radio frequency signals into a digitized received spectrum;
 a summing unit communicatively coupled to the host unit through at least a first cable and at least one remote antenna unit of the plurality of remote antenna units through at least a second cable, the summing unit positioned downstream of and remote from the host unit and upstream of and remote from the at least one remote antenna unit, the summing unit including a digital summer configured to sum a first digitized spectrum derived from a signal received by the summing unit from the at least one remote antenna unit with a second digitized spectrum to generate a digitally summed signal, the second digitized spectrum being from at least one site different than the site where the at least one remote antenna unit is located, wherein the digitally summed signal is transmitted toward the host unit; and wherein the received digital signal is derived from the digitally summed signal.

2. The distributed antenna system of claim 1, wherein the at least one remote antenna unit includes a first remote antenna unit; and wherein the second digitized spectrum is received by the summing unit from a second remote antenna unit of the plurality of remote antenna units.

3. The distributed antenna system of claim 2, wherein the second remote antenna unit is remote from the summing unit.

4. The distributed antenna system of claim 1, wherein the summing unit is a digital expansion unit.

5. The distributed antenna system of claim 1, wherein the host unit, summing unit, and plurality of remote antenna units are communicatively coupled over at least one communication medium.

6. The distributed antenna system of claim 5, wherein the at least one communication medium includes at least one optical communication medium;

wherein the transmitted digital signal is a transmitted digital optical signal; and wherein the received digital optical signal is a received digital optical signal.

7. The distributed antenna system of claim 1, wherein the host unit comprises:

a second digital summer configured to sum a first input digitized spectrum, derived from the received digital signal received by the host unit from the summing unit, with a second input digitized spectrum in order to generate an output digitally summed signal;

a digital-to-analog converter configured to convert an input digital signal, derived from the output digitally summed signal, in order to generate a digital-to-analog converted analog signal; and a mixer configured to frequency shift an input analog signal, derived from the digital-to-analog converted analog signal, in order to generate a mixed analog signal, wherein the uplink analog radio frequency signal is derived from the mixed analog signal.

8. A system for digital transport of a wireless spectrum, the system comprising:

a first unit located at a first site, the first unit including at least one cable interface;

a second unit remotely located from the first unit at a second site and communicatively coupled to the first unit by at least a first cable communicatively coupled to the at least one cable interface;

a third unit remotely located from the first unit at a third site and communicatively coupled to the second unit;

wherein the third unit is configured to receive, at the third site, a first analog wireless signal comprising first wireless spectrum and any transmissions from any wireless units within a first coverage area associated with the third unit;

wherein the third unit is configured to generate first digital samples indicative of at least a first portion of the first wireless spectrum of the first analog wireless signal;

wherein the third unit is configured to communicate the first digital samples to the second unit;

wherein the second unit is configured to digitally sum the first digital samples with second digital samples indicative of at least a second portion of a second wireless spectrum of a second analog wireless signal to produce first summed digital samples;

wherein the second unit is configured to communicate the first summed digital samples to the first unit using the first cable; and wherein the first unit is configured to derive an uplink analog radio frequency signal, in a form suitable for wireless transmission to a base station via an external interface of the base station, from the first summed digital samples, wherein the first unit is configured to output the uplink analog radio frequency signal to at least one receiver of the base station via the external interface of the base station.

9. The system of claim 8, wherein the third unit is remotely located from the second unit and communicatively coupled to the second unit through at least a second cable.

10. The system of claim 9, wherein the third unit is configured to communicate the first digital samples to the second unit using the second cable.

11. The system of claim 8, wherein the first unit is a host unit; and wherein the third unit is a remote antenna unit.

12. The system of claim 11, wherein the second unit is a digital expansion unit.

13. The system of claim 8, wherein the second digital samples are received at the second unit from a fourth unit remotely located from the second unit at a fourth site.

14. The system of claim 13, wherein the fourth unit is configured to receive, at the fourth site, the second analog wireless signal comprising the second wireless spectrum and any transmissions from any wireless units within a second coverage area associated with the fourth unit.

15. The system of claim 8, wherein the third unit comprises:

a respective analog-to-digital converter configured to digitize the first analog wireless signal in order to produce the first digital samples.

16. The system of claim 8, wherein the third unit is configured to generate the first digital samples by frequency shifting the first analog wireless signal and digitizing the frequency-shifted first analog wireless signal.

17. The system of claim 8, wherein the third unit is configured to generate the first digital samples by down converting the first analog wireless signal and digitizing the down-converted first analog wireless signal.

18. The system of claim 8, wherein the second portion of the second wireless spectrum overlaps in wireless spectrum with the first portion of the first wireless spectrum.

19. The system of claim 8, wherein the second portion of the second wireless spectrum covers the same frequency range as the first portion of the first wireless spectrum.

20. The system of claim 8, wherein the first unit comprises:

a digital summer configured to digitally sum first input digital samples with second input digital samples in order to produce output digital samples, the first input digital samples derived from the first summed digital samples;

a digital-to-analog converter configured to convert an input digital signal, derived from the output digital samples, in order to generate a digital-to-analog converted analog signal; and a mixer configured to frequency shift an input analog signal, derived from the digital-to-analog converted analog signal, in order to generate a mixed analog signal, wherein the uplink analog radio frequency signal is derived from the mixed analog signal.

21. A first unit used in digital transport of a wireless spectrum, the first unit comprising:
- a first cable interface configured to communicatively couple the first unit to a second upstream unit located remotely from the first unit at a second site through a first cable;
- a second cable interface configured to communicatively couple the first unit to a third downstream unit located remotely from the first unit at a third site, the second cable interface configured to receive first digital samples from the third downstream unit, the first digital samples indicative of at least a first portion of a first wireless spectrum of a first analog wireless signal comprising the first wireless spectrum and any transmission received at the third downstream unit positioned at the third site from any wireless units within a first coverage area associated with the third downstream unit;
- a digital summer configured to digitally sum the first digital samples with second digital samples indicative of at least a second portion of a second wireless spectrum of a second analog wireless signal to produce first summed digital samples;
- wherein the first cable interface is configured to communicate the first summed digital samples to the second upstream unit using the first cable, wherein the second upstream unit is configured to derive an uplink analog radio frequency signal from the first summed digital samples in a form suitable for wireless transmission to a base station via an external interface of the base station, wherein the second upstream unit is configured to output the uplink analog radio frequency signal to at least one receiver of the base station via the external interface of the base station.

22. The first unit of claim 21, wherein the first unit is a digital expansion unit;
wherein the second upstream unit is a host unit; and
wherein the third downstream unit is a remote antenna unit.

23. The first unit of claim 21, wherein the second digital samples are received at the first unit from a fourth downstream unit remotely located from the first unit at a fourth site; and
wherein the fourth downstream unit is configured to receive, at the fourth site, the second analog wireless signal comprising the second wireless spectrum and any transmissions from any wireless units within a second coverage area associated with the fourth downstream unit.

24. The first unit of claim 21, wherein the second portion of the second wireless spectrum overlaps in wireless spectrum with the first portion of the first wireless spectrum.

25. The first unit of claim 21, wherein the second portion of the second wireless spectrum covers the same frequency range as the first portion of the first wireless spectrum.

* * * * *